(12) United States Patent
Matsubara et al.

(10) Patent No.: US 11,372,034 B2
(45) Date of Patent: Jun. 28, 2022

(54) INFORMATION PROCESSING DEVICE

(71) Applicant: FUJITSU LIMITED, Kawasaki (JP)

(72) Inventors: Satoshi Matsubara, Machida (JP);
Motomu Takatsu, Shinjuku (JP)

(73) Assignee: FUJITSU LIMITED, Kawasaki (JP)

( * ) Notice: Subject to any disclaimer, the term of this patent is extended or adjusted under 35 U.S.C. 154(b) by 324 days.

(21) Appl. No.: 16/788,420

(22) Filed: Feb. 12, 2020

(65) Prior Publication Data

US 2020/0278385 A1    Sep. 3, 2020

(30) Foreign Application Priority Data

Mar. 1, 2019   (JP) .............................. JP2019-037634

(51) Int. Cl.
| | |
|---|---|
| *G01R 21/133* | (2006.01) |
| *G05D 23/19* | (2006.01) |
| *G06N 7/00* | (2006.01) |
| *G11C 11/56* | (2006.01) |
| *H03K 19/00* | (2006.01) |

(52) U.S. Cl.
CPC ....... *G01R 21/133* (2013.01); *G05D 23/1902* (2013.01); *G06N 7/005* (2013.01); *G11C 11/5607* (2013.01); *H03K 19/0002* (2013.01)

(58) Field of Classification Search
CPC .............. G01R 21/133; G05D 23/1902; G06F 17/11; G06N 5/003; G06N 7/005; G11C 11/5607; H03K 19/0002
See application file for complete search history.

(56) References Cited

U.S. PATENT DOCUMENTS

| | | | |
|---|---|---|---|
| 2003/0144748 A1* | 7/2003 | Nakamura | ........... G05B 13/024 |
| | | | 700/28 |
| 2003/0164490 A1 | 9/2003 | Blais | |

(Continued)

FOREIGN PATENT DOCUMENTS

| | | |
|---|---|---|
| JP | 2004-531793 A | 10/2004 |
| JP | 2016-066378 A | 4/2016 |
| JP | 2018-041351 A | 3/2018 |

OTHER PUBLICATIONS

Taibi et al., Metaheuristics: From Design to Implementation, John Wiley & Sons, Inc., 2009, p. 1-618. (Year: 2009).*

(Continued)

*Primary Examiner* — Kidest Bahta
(74) *Attorney, Agent, or Firm* — Fujitsu Patent Center

(57) ABSTRACT

An information processing device includes: a memory; and a processor configured to: hold each of values of state variables included in an evaluation function representing energy; calculate the change value of the energy for each of state transitions, when a state transition occurs due to a change of any of the values of the state variables; control a temperature value representing temperature; select any of the state transitions, based on priority information set based on state transition information updated last time with respect to identification information for identifying each state transition, and transition acceptance information indicating transition acceptance determined based on the change value, and a generated thermal noise; and output a lowest energy state which is the values of the state variables when the energy to be updated based on the selected state transition becomes a lowest value.

5 Claims, 17 Drawing Sheets

(56) References Cited

U.S. PATENT DOCUMENTS

| 2013/0262032 | A1* | 10/2013 | Ide | G01S 19/34 |
| | | | | 702/181 |
| 2015/0324690 | A1* | 11/2015 | Chilimbi | G06N 3/063 |
| | | | | 706/27 |
| 2016/0065210 | A1 | 3/2016 | Yoshimura et al. | |
| 2018/0075342 | A1 | 3/2018 | Tamura et al. | |

OTHER PUBLICATIONS

Li, Yaohang et al., "Hybrid parallel tempering and simulated annealing method", Applied Mathematics and Computation, Elsevier, US, vol. 212, No. 1, Jun. 2009, pp. 216-228, XP026085856.

Chen, Ding-Jun et al., "Parallelizing simulated annealing algorithms based on high-performance computer", Journal of Global Optimization, Kluwer Academic Publishers, DO, vol. 39, No. 2, Feb. 20, 2007, pp. 261-289, XP019529771.

Munakata, Toyonori et al., "Temperature control for simulated annealing", Physical Review E. Statistical Physics, Plasmas, Fluids, and Related Interdisciplinary Topics., vol. 64, No. 4, pp. 046127-1-046127-5, Sep. 2001, XP055685109.

Azizi, Nader et al., "Adaptive temperature control for simulated annealing:a comparative study", Computers and Operations Research, vol. 31, No. 14, Dec. 2004, pp. 2439-2451, XP055685111.

Kirkpatrick, S. et al., "Optimization by Simulated Annealing", Science, American Association for the Advancement of Science, US, vol. 220, No. 4598, May 13, 1983, pp. 671-680, XP000575729.

Ingber, Lester, "ASA Options (Adaptive Simulated Annealing)", 2012, pp. 1-22, XP055499224, Retrieved from the Internet:URL:https://www.researchgate.net/publication/235426530_Adaptive_Simulated_Annealing.

Du, Ke-Lin et al., "Simulated Annealing", In:"Search and optimization by metaheuristics", 2016, Springer International Publishing, Cham, pp. 29-36, XP055489122.

Extended European Search Report dated Jul. 30, 2020 for corresponding European Patent Application No. 20157787.1, 11 pages.

* cited by examiner

INFORMATION PROCESSING DEVICE

CROSS-REFERENCE TO RELATED APPLICATION

This application is based upon and claims the benefit of priority of the prior Japanese Patent Application No. 2019-37634, filed on Mar. 1, 2019, the entire contents of which are incorporated herein by reference.

FIELD

The embodiments discussed herein are related to an optimization device and a control method of the optimization device.

BACKGROUND

In current society, information processing has been carried out in various fields. The information processing is performed by using a computing device such as a computer, and various kinds of data are operated and processed to obtain meaningful results, so that prediction, determination and control are performed. There are optimization problems as one field of the information processing, which is an important field. For example, there are a problem of minimizing resources and costs required for performing a certain process, a problem of obtaining a solution that maximizes an effect of the process, and the like. It is apparent that these problems are very important.

Related art is disclosed in Japanese Laid-open Patent Publication No. 2018-41351, Japanese Laid-open Patent Publication No. 2016-66378 and Japanese National Publication of International Patent Application No. 2004-531793.

SUMMARY

According to an aspect of the embodiments, an information processing device includes: a memory; and a processor coupled to the memory and configured to: hold each of values of a plurality of state variables included in an evaluation function representing energy; calculate the change value of the energy for each of a plurality of state transitions, when a state transition occurs due to a change of any of the values of the plurality of state variables; control a temperature value representing temperature; select any of the plurality of state transitions, based on priority information set based on state transition information updated last time with respect to identification information for identifying each state transition, and transition acceptance information indicating transition acceptance determined based on the change value of the energy, and a generated thermal noise; and output a lowest energy state which is the values of the plurality of state variables when the energy to be updated based on the selected state transition becomes a lowest value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
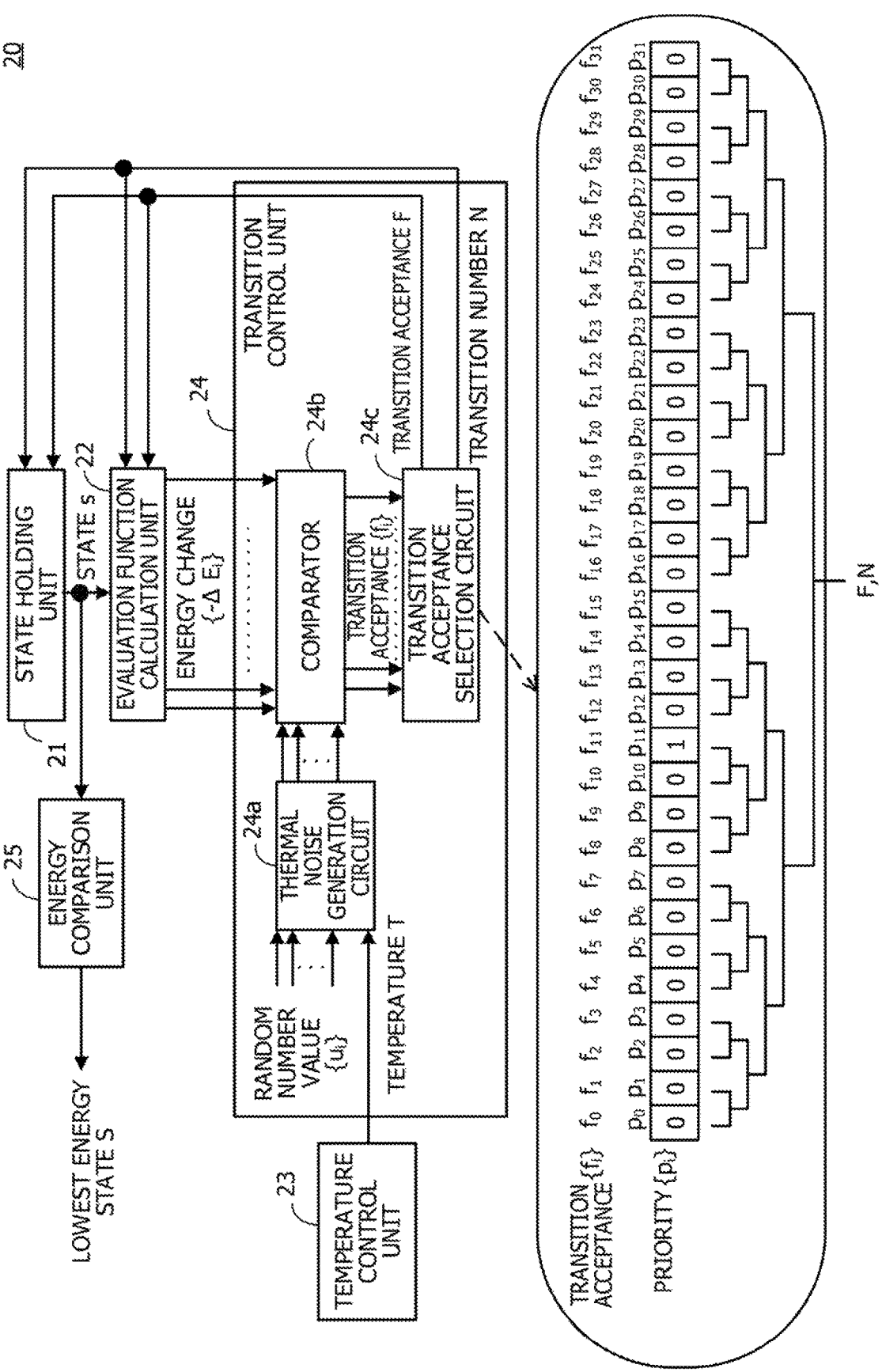
FIG. 1 is a diagram illustrating an example of an optimization device according to a first embodiment.

There is a linear programming problem as a representative of the optimization problem. This is a problem of obtaining a value of a variable that maximizes or minimizes an evaluation function represented by a linear sum of a plurality of continuous variables under a constraint condition represented by a linear sum, and is used in various fields such as a production plan of products. The linear programming problem has been known to have an excellent solution such as a simplex method, or an internal point method, and these methods may efficiently solve even a problem having hundreds of thousands or more of variables.

On the other hand, there are many known optimization problems in which a variable takes a discrete value rather than a continuous value. For example, there are a traveling salesman problem of obtaining a shortest route for visiting a plurality of cities in order and returning to the origin city, a knapsack problem of obtaining a combination of items such that when different items are packed in a knapsack, a sum of the values of the items becomes maximum, and the like. Such a problem is called a discrete optimization problem, a combinatorial optimization problem, or the like, and it has been known to be very difficult to obtain an optimal solution for the problem.

The greatest reason why it is difficult to solve the combinatorial optimization problem is that each variable takes only a discrete value, so that it is impossible to use a technique that reaches an optimal solution by allowing the variable to be continuously changed in a direction in which an evaluation function is improved. In addition to the value of the variable which gives the original optimal value (an optimal solution, a global solution), there are a very large number of values (local minimum (maximum) solutions, local solutions) which locally give an extreme value of the evaluation function. Therefore, it is required to use a brute-force method in order to reliably obtain the optimal solution, so that calculation time becomes very long. Among the combinatorial optimization problems, there are many problems in which calculation time required for obtaining an optimal solution, called a non-deterministic polynomial-time (NP) hardness problem in computational complexity theory, is expected to exponentially increase with respect to a magnitude of the problem (that is, the number of variables). The above-mentioned traveling salesman problem and knapsack problem are also NP hardness problems.

As described above, it is very difficult to reliably obtain the optimal solution of the combinatorial optimization problem. Therefore, for a practically important combinatorial optimization problem, a solution method in which characteristics inherent in the problem are utilized has been devised. As described above, since it is expected that it takes calculation time that exponentially increases to obtain an exact solution in many combinatorial optimization problems, practical solution methods are mostly an approximate solution method, and it is possible to obtain a solution in which a value of the evaluation function is not an optimal solution but close to the optimal value.

With respect to the approximate solution method focused on these problems, an approximate solution method that may deal with a wide range of problems is also known to solve these problems without using the characteristics of the problems. These are referred to as metaheuristic solutions, which include a simulated annealing method (SA method), genetic algorithms, neural networks, and the like. These methods may be less efficient than solution methods that successfully utilize the characteristics of the problems, but may be expected to obtain a solution at higher speed than the solution methods that obtain an exact solution.

The simulated annealing method will be described below.

The simulated annealing method is a type of Monte Carlo methods and is a method of stochastically obtaining a solution by using random number values. Hereinafter, a problem of minimizing a value of an evaluation function to be optimized will be described as an example, and the value of the evaluation function will be referred to as energy. In a case of maximization, a sign of the evaluation function may be changed.

A state transition that starts from an initial state in which one discrete value is assigned to each variable (hereinafter, referred to as a state variable) and selects, by using a current state (combination of values of state variables), a state close to the current state (for example, a state in which only one state variable is changed) is considered. A change in energy with respect to the state transition is calculated, and it is stochastically determined whether to change the state by adopting the state transition or to maintain the original state without adopting the state transition, depending on the calculated value of the change in energy. When an adoption probability in a case where the energy decreases is selected to be higher than that in a case where the energy increases, the state is changed on average in a direction in which the energy decreases, and thus it is possible to expect that the state transits to a more appropriate state with the lapse of time. Finally, an optimal solution or an approximate solution that gives energy close to the optimal value may be obtained. When the case where the energy decreases is adopted and the case where the energy increases is not adopted deterministically, the change in energy weakly decreases with respect to time. However, after reaching a local solution, no further change occurs. Since a very large number of local solutions exist in the combinatorial optimization problem as described above, the state is trapped to a local solution that is not so close to the optimal value, in many cases. Thus, it is important to stochastically determine whether or not to adopt the case.

In the simulated annealing method, it is proved that the state reaches the optimal solution at a limit of infinite time (the number of iterations) as long as the adoption (acceptance) probability of the state transition is determined as follows.

With respect to an energy change ($\Delta E$) accompanied by the state transition, an acceptance probability p of the state transition is determined by the following function f(x) represented by Equation (1). Equation (2) is the Metropolis method. Equation (3) is the Gibbs method.

$$p(\Delta E, T) = f\left(-\frac{\Delta E}{T}\right) \quad (1)$$

$$f_{metro}(x) = \min(1, e^x) \quad (2)$$

$$f_{Gibbs}(x) = \frac{1}{1 + e^{-x}} \quad (3)$$

T is a value indicating a temperature, and is changed as follows.

That is, for example, the temperature T is logarithmically reduced with respect to the number of iterations t as represented by the following equation.

$$T = \frac{T_0 \log(c)}{\log(t + c)} \quad (4)$$

It is required that $T_0$ is an initial temperature and is sufficiently high in accordance with a problem.

In a case of using the acceptance probability represented by Equations (1) to (3), when it is assumed that the state reaches a steady state after sufficient iterations, an occupancy probability of each state follows the Boltzmann distribution in a thermal equilibrium state in thermodynamics. Since the occupancy probability of a low-energy state increases when the temperature gradually decreases from high temperature, the low-energy state may be obtained when the temperature sufficiently decreases. Since this behavior is similar to a state change in annealing a material, the method is called the simulated annealing method. At this time, a case where the state transition in which energy increases stochastically occurs corresponds to thermal excitation in physics.

As described above, in the simulated annealing method, when the number of iterations is infinite, the optimal solution may be obtained. However, since, in practice, it is required to obtain a solution with the number of iterations that is finite, it is not possible to reliably obtain the optimal solution. Since, in the above equation, the temperature decreases very slowly, the temperature does not sufficiently decrease in a finite time. Thus, in the practical simulated annealing method, the temperature is not logarithmically changed, and decreases more quickly, in many cases.

Figure 17:
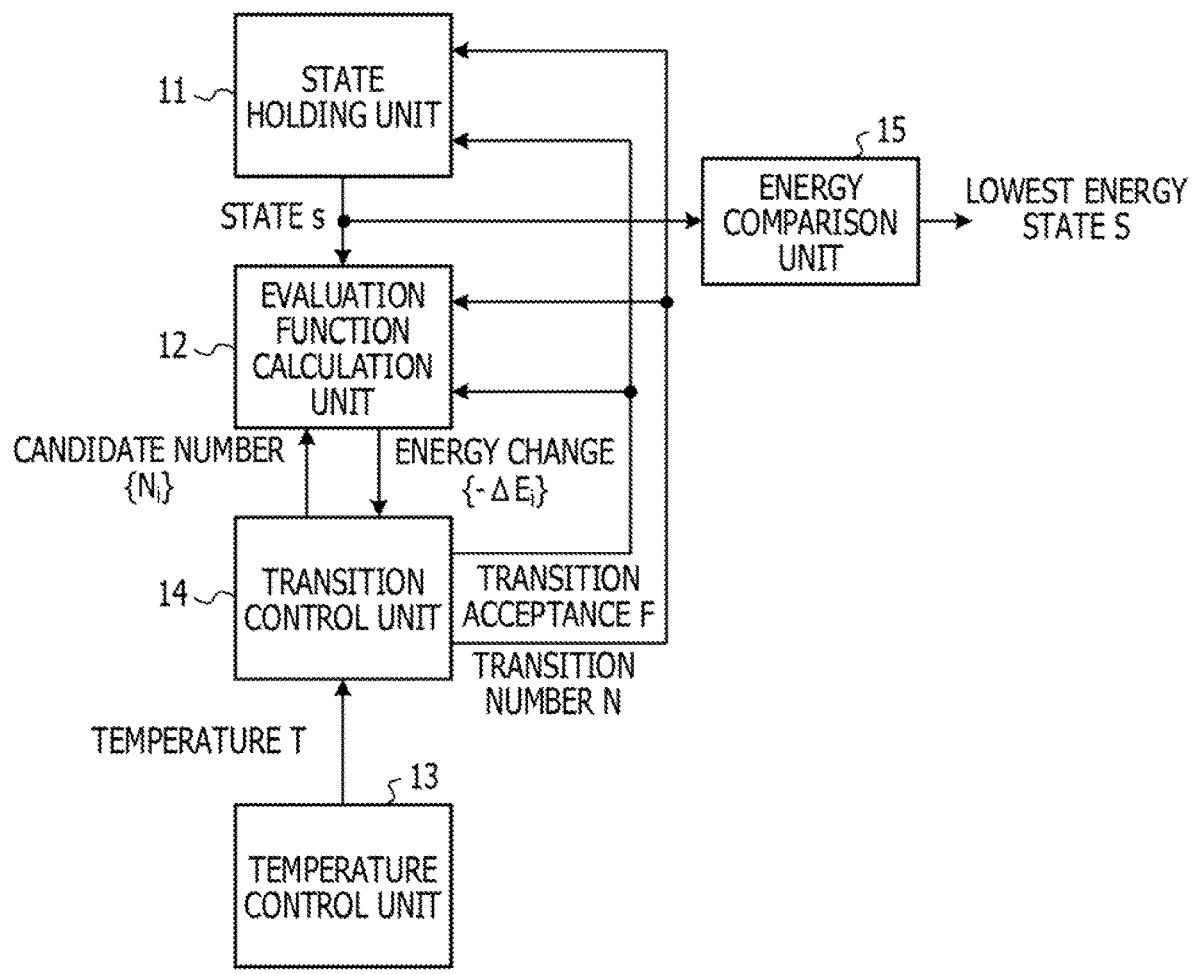
FIG. 17 illustrates a conceptual configuration of an optimization device according to a simulated annealing method.

FIG. 17 illustrates a conceptual configuration of an optimization device according to the simulated annealing method. However, in the following description, a case where a plurality of candidates for the state transition is generated will be described, but the original basic simulated annealing method generates transition candidates one by one.

An optimization device 10 includes a state holding unit 11 which holds a current state s (values of a plurality of state variables). The optimization device 10 also includes an evaluation function calculation unit 12 configured to calculate a change value (hereinafter, denoted as the energy change $\{-\Delta E_i\}$) of energy of each state transition when the state transition from the current state s due to the change in any of the values of the plurality of state variables occurs. The optimization device 10 includes a temperature control unit 13 configured to control the temperature T and a transition control unit 14 configured to control the state change. The transition control unit 14 stochastically determines whether to accept any of a plurality of state transitions or not, depending on a relative relation between the energy change value $\{-\Delta E_i\}$ and thermal excitation energy based on the temperature T, the energy change $\{-\Delta E_i\}$, and a random number value. The optimization device 10 further includes an energy comparison unit 15 configured to specify the lowest energy state S among respective states caused by the state transition.

Operations in one iteration are as follows. Firstly, the transition control unit 14 generates one or a plurality of candidates (candidate numbers $\{N_i\}$) for the state transition from the current state s held by the state holding unit 11 to the next state. The evaluation function calculation unit 12 calculates the energy change $\{-\Delta E_i\}$ for each of the state transitions listed as the candidates, by using the current state s and the candidates for the state transition. The transition control unit 14 uses the temperature T generated in the temperature control unit 13 and a random variable (random number value) generated by a random number generation unit in the transition control unit 14, and allows the state transition with the acceptance probability of the above Equations (1) to (3) depending on the energy change $\{-\Delta E_i\}$ of each state transition. The transition control unit 14 calculates a transition acceptance $\{f_i\}$ indicating whether to accept each state transition or not (propriety of the state transition). In a case where a plurality of allowed state transitions exists, the transition control unit 14 randomly selects one thereof by using a random number value. The transition control unit 14 outputs a transition number N and a transition acceptance F of the selected state transition. In a case where the allowed state transition exists, the value of the state variable stored in the state holding unit 11 is updated according to the adopted state transition.

After starting from the initial state, when the above iterations are performed while the temperature control unit 13 decreases the temperature value, and the number of iterations reaches a predetermined value, or when an end determination condition, such as a condition where the energy is lower than a predetermined value, is satisfied, the operation ends. An answer output by the optimization device 10 is the state at the end of the operation. In practice, the temperature T does not become 0 with a finite number of iterations, so that the occupancy probability of the state even at the end of the operation has a distribution represented by the Boltzmann distribution or the like, and is not necessarily the optimal value or a favorable solution. Thus, a realistic solution is to cause the energy obtained so far in the middle of iterations to hold the lowest state and finally to output the lowest state.

A transition probability in a method (hereinafter, referred to as a parallel search method) in which a plurality of candidates for a state transition is generated and one state transition is selected from among the plurality of candidates may be increased more than that in a method in which candidates for a state transition are generated one by one. For example, a transition probability of a state at a time of parallel search by the annealing method in which the number of the state transitions is N in the optimization device 10 is approximately N times of that by a method in which candidates for a state transition are generated one by one, when the transition probability is sufficiently small, as represented by Equations (5) and (6).

$$P_{single} = \sum_i^N \frac{1}{N} A(\Delta E_i) \quad (5)$$

$$P_{parallel} = 1 - \prod_i^N (1 - A(\Delta E_i)) \approx \sum_i^N A(\Delta E_i) = N * P_{single} \quad (6)$$

N is the number of the state transitions. $A(\Delta E_i)$ is the acceptance probability of the i-th state transition, and is sufficiently small. $P_{single}$ is a transition probability in searching for one state transition alone. $P_{parallel}$ is a transition probability when the parallel search is performed for N state transitions.

When the transition control unit 14 is implemented by hardware, the transition control unit 14 includes, for example, a selection circuit configured to select the transition acceptance F which is one of the transition acceptances $\{f_i\}$ from among the transition acceptances $\{f_i\}$ at random by using the random number value. The selection circuit includes, for example, a plurality of selectors arranged in a binary tree structure. Of two transition acceptances that are input, each selector preferentially outputs the one indicating that transition is possible. In a case where the two transition acceptances that are input are identical (both transition acceptances indicate that transition is possible, or that transition is impossible), each selector selects and outputs one of the two transition acceptances at random by using a random number value output from a random number generation circuit.

A mechanism in which the transition control unit 14 allows the state transition with the acceptance probability represented by Equations (1) to (3) is not described so far, and the description will be supplemented.

A circuit that outputs 1 with the acceptance probability p and outputs 0 with the acceptance probability (1−p) may be implemented by inputting the acceptance probability p to an input a of a comparator which has two inputs a and b, and which outputs 1 in a case of a>b, and outputs 0 in a case of a<b, and by inputting uniform random numbers taking a value of a section [0, 1] to the input b. Thus, when a value of the acceptance probability p calculated with Equation (1) by using the energy change and the temperature T is input to the input a of the comparator, it is possible to enable the above function.

That is, for example, when f is defined as a function used in Equation (1), and u is defined as a uniform random number having a value of a section [0, 1], it is possible to enable the above function by a circuit that outputs 1 as the transition acceptance F when f(ΔE/T) is larger than u.

Such a configuration may be adopted, and it is possible to enable the same function even when modification as follows is made. Even when the same monotonically increasing function is applied to two numbers, a magnitude relationship therebetween does not change. Therefore, even when the same monotonically increasing function acts on the two inputs of the comparator, the output does not change. When an inverse function $f^{-1}$ of f is employed as the monotonically increasing function, it is understood that a circuit that outputs 1 when −ΔE/T is larger than $f^{-1}(u)$ or a circuit that outputs 1 when ΔE/T is equal to or smaller than $f^{-1}(u)$ may be used. Since the temperature T is positive, a circuit that outputs 1 when −ΔE is larger than $Tf^{-1}(u)$, or a circuit that outputs 1 when ΔE is smaller than or equal to $Tf^{-1}(u)$ may be used. The transition control unit 14 generates the uniform random number u, and outputs a value of $f^{-1}(u)$ by using a conversion table for converting the generated uniform random number u into the value of $f^{-1}(u)$. When the Metropolis method is applied, $f^{-1}(u)$ is given by Equation (7). When the Gibbs method is applied, $f^{-1}(u)$ is given by Equation (8).

$$f^{-1}_{metro}(u) = \log(u) \quad (7)$$

$$f^{-1}_{Gibbs}(u) = \log\left(\frac{u}{1-u}\right) \quad (8)$$

As a method for calculating the optimization problem by software, there has been known a method in which one of the transition acceptances {$f_i$} for each state transition is sequentially searched in order of numbers (hereinafter referred to as bit numbers) for identifying each state transition rather than at random. In this search method, for example, first, a state transition with the smallest bit number is selected as a transition candidate, a transition acceptance of the state transition is searched, and when the transition acceptance is "1" (transition is possible), the state transition is performed, and when the transition acceptance is "0" (transition is impossible), the state transition is not performed. Thereafter, a state transition with a bit number which is one larger than the previously searched bit number is selected as a transition candidate, a transition acceptance of the state transition is searched, and processing according to the transition acceptance is repeated in the same manner. When a transition acceptance of a state transition with the largest bit number is searched, the transition acceptance of the state transition with the smallest bit number is searched again at the following process.

In a semiconductor device in which a plurality of units corresponding to spins in the Ising model is provided in an array, there has been a technique for simultaneously updating a plurality of spins while not updating spins adjacent to the spins to be updated at the same time. In a quantum computer, there has also been a technique which makes quantum computation in a one dimensional array of quantum bits limited to nearest neighbor coupling more efficient by rearranging an order of the quantum bits.

As Monte Carlo methods for solving the optimization problem, there are methods other than the simulated annealing method. Among them, a replica exchange method (also referred to as an exchange Monte Carlo method) is a method in which, instead of gradually decreasing a temperature by the simulated annealing method, state transitions are independently (logically) performed in parallel with respect to a plurality of temperatures, and an effect similar to that of annealing is achieved by exchanging states between the different temperatures according to an appropriate criterion for determination.

In a Markov Chain Monte Carlo method such as the simulated annealing method or the replica exchange method, a method of randomly generating transition candidates one by one is theoretically easily handled, so that the method is a basic method. However, when searching an optimal solution is actually performed, it is known that a method in which transition candidates are generated one by one in order may reach the optimal solution faster in many problems. For example, in cases of a maximum cut problem, the traveling salesman problem, and a spin glass problem, it has been found that a method in which transition candidates are generated in order is faster.

In an optimization device of related art that performs a parallel search, a method is applied in which state transitions as transition candidates are randomly selected, and a method is not applied which makes a method in which transition candidates are sequentially generated faster by parallelization of circuits. Therefore, in the optimization device of related art, it is considered that calculation speed may be slow depending on the kinds of the combinatorial optimization problems.

In one aspect, an optimization device and a control method of the optimization device capable of solving a combinatorial optimization problem at high speed may be provided.

Embodiments of the present disclosure will be described below with reference to the accompanying drawings. Although description is made by taking a simulated annealing method as an example, a replica exchange method may be applied in the same manner, because a transition rule of a state at each temperature in the replica exchange method is exactly the same as that of the simulated annealing method. Although description is made by taking an Ising model in which an objective function (energy) to be optimized is represented by a quadratic expression for binary variables as an example, even in other cases, the same method may be basically applied as long as transition numbers may be defined.

In the simulated annealing of the Ising model, there is only one state variable that changes according to the state transition. In the following description, identification information for identifying each state transition is equal to a bit number of one state variable (also referred to as a bit), but is not limited to a form where a state transition number and a variable number that changes according to the state transition are identical to each other.

First Embodiment

FIG. 1 is a diagram illustrating an example of an optimization device according to a first embodiment.

An optimization device 20 includes a state holding unit 21, an evaluation function calculation unit 22, a temperature control unit 23, a transition control unit 24, and an energy comparison unit 25.

The state holding unit 21 holds the state s (the values of the plurality of state variables) included in an evaluation function representing energy. The state holding unit 21 updates the value of the state variable based on the transition acceptance F and the transition number N output from the transition control unit 24. The state holding unit 21 may be implemented by using, for example, a register and a memory (for example, random-access memory (RAM)) for holding the values of the plurality of state variables, a logic circuit for inverting the value of the state variable from 1 to 0 or from 0 to 1 based on the transition acceptance F and the transition number N, and the like. When the transition acceptance F is a value (for example, 1) which represents allowance of the state transition having the transition number N, the value of the state variable corresponding to the transition number N is changed.

In a case where a state transition occurs due to a change in any of the values of the plurality of state variables, the evaluation function calculation unit 22 calculates a change value of energy for each of a plurality of state transitions. In the following, the change value of the energy calculated for each of the plurality of state transitions is denoted as the energy change $\{-\Delta E_i\}$.

An evaluation function $E(x)$ representing energy is represented by, for example, the following Equation (9).

$$E(x) = -\sum_{(i,j)} W_{ij} x_i x_j - \sum_i b_i x_i \quad (9)$$

A first term at the right side is obtained by accumulating a product of the values of the two state variables (0 or 1) and a weight coefficient, without overlap and leakage, for all combinations of the state variables. $x_i$ is a state variable whose identification information (hereinafter, referred to as a bit number) is i, $x_j$ is a state variable whose bit number=j, and $W_{ij}$ is a weight coefficient indicating a magnitude of interaction between the state variables having the bit numbers=i and j. In this case, $W_{ii}=0$ is satisfied. $W_{ij}=W_{ji}$ is satisfied in many cases (that is, for example, a coefficient matrix of weight coefficients is a symmetric matrix in many cases). The weight coefficient $W_{ij}$ has a predetermined bit width (for example, 16 bits, 32 bits, 64 bits, 128 bits, or the like).

A second term at the right side is a sum of a product of values of a bias coefficient and a state variable, for each of all state variables. $b_i$ represents the bias coefficient for the state variable whose bit number is i.

When the state variable $x_i$ changes to $1-x_i$, an increase in the state variable $x_i$ is represented by $\Delta x_i=(1-x_i)-x_i=1-2x_i$. An energy change $\Delta E_i$ in response to spin reversal (the change in the value of the state variable) is represented by the following Equation (10).

$$\Delta E_i = E(x)|_{x_i \to 1-x_i} - E(x) = -\Delta x_i \left( \sum_j W_{ij} x_j + b_i \right) = -\Delta x_i h_i \quad (10)$$

In Equation (10), when the state variable $x_i$ changes from 1 to 0, $\Delta x_i$ is equal to $-1$. When the state variable $x_i$ changes from 0 to 1, $\Delta x_i$ is equal to 1. $h_i$ is referred to as a local field. A value obtained by multiplying the local field $h_i$ by a sign (+1 or −1) in response to the value $\Delta x_i$ is the energy change $\Delta E_i$.

A change $\Delta h_i$ in the local field $h_i$ in a case where the state variable $x_j$ changes from 0 to 1 is represented by $+W_{ij}$, whereas the change $\Delta h_i$ in the local field $h_i$ in a case where the state variable $x_j$ changes from 1 to 0 is represented by $-W_{ij}$. Therefore, the local field $h_i$ does not have to be recomputed every time through a matrix operation, and the weight value $W_{ij}$ may be added or subtracted only for the change in the state variable that changes in response to the state transition.

The evaluation function calculation unit 22 is implemented by using, for example, a logic circuit such as a product-sum operation circuit, a register or a memory (for example, RAM) for holding a weight coefficient or a bias coefficient, and the like. The register or the memory for holding the weight coefficient and the bias coefficient may be outside the evaluation function calculation unit 22.

The temperature control unit 23 controls the temperature T. In order to implement the simulated annealing method, the temperature control unit 23 performs control to lower the temperature T in accordance with a predetermined schedule, for example.

The temperature control unit 23 may be implemented by, for example, an application-specific electronic circuit such as an application-specific integrated circuit (ASIC) or a field-programmable gate array (FPGA). The temperature control unit 23 may be a processor such as a central processing unit (CPU) or a digital signal processor (DSP). In such a case, the processor controls the temperature T described above by executing a program stored in a memory (not illustrated).

The transition control unit 24 holds priority information (hereinafter, denoted as a priority $\{p_i\}$) set based on a state transition number that has been updated last time, with respect to the identification information for identifying each state transition. The transition control unit 24 selects any one of the plurality of state transitions based on the priority $\{p_i\}$ and transition acceptance information (the transition acceptance $\{f_i\}$ described above) indicating the transition acceptance determined based on the temperature T, the energy change $\{-\Delta E_i\}$, and a generated thermal noise.

As illustrated in FIG. 1, the transition control unit 24 includes, for example, a thermal noise generation circuit 24a, a comparator 24b, and a transition acceptance selection circuit 24c.

The thermal noise generation circuit 24a includes, for example, a memory (for example, RAM) for storing a noise table for converting the random number value $\{u_i\}$ independent for each bit number into the value of the inverse function $f^{-1}(u)$ described above. The thermal noise generation circuit 24a outputs the product of the temperature T and each value output from the noise table as a thermal noise ($Tf^{-1}(u)$) in the Metropolis method or the Gibbs method.

The comparator 24b outputs the transition acceptance $\{f_i\}$ indicating whether or not the state transition corresponding to each bit number is allowed, in response to a comparison result between the thermal noise for each bit number output from the thermal noise generation circuit 24a and the energy change $\{-\Delta E_i\}$ of the corresponding bit number. When the comparator 24b is a circuit configured to output the transition acceptance F indicating that the state transition is accepted when $\{-\Delta E_i\} < Tf^{-1}(u)$, the acceptance probability of the state transition becomes smaller as the energy change $\{-\Delta E_i\}$ becomes larger in a positive direction.

The transition acceptance selection circuit 24c sets the priority $\{p_i\}$ based on state transition information (the transition acceptance F and the transition number N) that has been updated last time. The transition acceptance selection circuit 24c includes a holding unit that holds the priority $\{p_i\}$. The transition acceptance selection circuit 24c selects any one of the plurality of state transitions based on the priority $\{p_i\}$ and the transition acceptance $\{f_i\}$, and outputs the transition number N as the bit number of the selected state transition and the transition acceptance F as the transition acceptance $\{f_i\}$ of the selected state transition.

The transition acceptance selection circuit 24c selects a state transition to be a transition candidate preferentially from a smaller bit number or a larger bit number based on the priority $\{p_i\}$ which is the priority information, thereby enabling sequential selection.

The transition acceptance selection circuit 24c determines a priority order of the state transitions in accordance with the following rule. In the following description, the transition acceptance selection circuit 24c selects a state transition to be a transition candidate preferentially from a smaller bit number.

The transition acceptance selection circuit 24c minimizes the priority order of the state transition whose state variable which has undergone the previous transition is transited again, and maximizes the priority order of the state transition whose bit number is one larger than that of the state transition which has undergone the previous transition. As for the state transition whose bit number is larger than the bit number of the state transition whose priority order is the highest, the transition acceptance selection circuit 24c lowers the priority order as the bit number becomes larger. The transition acceptance selection circuit 24c makes the priority order of the state transition with the minimum bit number one lower than the priority order of the state transition with the maximum bit number. As for the state transition whose bit number is smaller than the bit number of the state transition whose priority order is the lowest, the transition acceptance selection circuit 24c lowers the priority order as the bit number becomes larger.

The above rule may be achieved by using a plurality of selectors that is arranged in a binary tree structure and each of which selects and outputs one of two transition acceptances according to the priority $\{p_i\}$ which has one bit for each bit number and which is set as below for each bit number, and the following rule.

For example, the transition acceptance selection circuit 24c sets the priority $\{p_i\}$ of the state transition having the bit number which is one larger than the bit number (update bit number) for identifying the state transition which has been updated last time among the plurality of bit numbers (the state variable which has undergone the previous transition) to 1. The transition acceptance selection circuit 24c sets the priority $\{p_i\}$ of each of the state transitions of the other bit numbers to 0.

FIG. 1 illustrates an example of the priorities $\{p_i\}$ ($p_0$ to $p_{31}$) set for the 32 state transitions in a case where the update bit number is 10. As illustrated in FIG. 1, for the state transition whose bit number is 11 that is one larger than the bit number 10, 1 is set as the priority $p_{11}$, and for the state transitions of the other bit numbers, 0 are set as the priorities $p_0$ to $p_{10}$ and $p_{12}$ to $p_{31}$. 0 and 1 may be set to be opposite to each other.

Each of the plurality of selectors arranged in the binary tree structure inputs the transition acceptances $\{f_i\}$ of two state transitions, the priorities $\{p_i\}$ and the bit numbers of the two state transitions. For example, among the plurality of selectors arranged in the binary tree structure, each of a plurality of selectors in a first stage inputs the transition acceptances $\{f_i\}$, the priorities $\{p_i\}$, and the bit numbers of the two state transitions whose bit numbers are adjacent to each other. The bit number, corresponding to the energy change $\{-\Delta E_i\}$, is supplied from the evaluation function calculation unit 22, for example. Each of the plurality of selectors may generate an address corresponding to the selected bit number. An example of the selector configured to generate an address indicating a bit number will be described later. Hereinafter, the address indicating the bit number will also be referred to as the bit number.

Each of the plurality of selectors arranged in the binary tree structure outputs the transition acceptance $\{f_i\}$ and the bit number of the state transition whose transition acceptance $\{f_i\}$ is 1, when one of the transition acceptances $\{f_i\}$ of two state transitions that are input is 1.

On the other hand, each of the plurality of selectors arranged in the binary tree structure outputs the transition acceptance $\{f_i\}$ and the bit number of the state transition having a larger bit number, when both of the transition acceptances $\{f_i\}$ of the two state transitions that are input are 1 and the priority $\{p_i\}$ of the state transition having the larger bit number is 1. Otherwise, each of the plurality of selectors outputs the transition acceptance $\{f_i\}$ and the bit number of the state transition having the smaller bit number.

Each of the plurality of selectors arranged in the binary tree structure propagates the priority $\{p_i\}$ to the next stage in accordance with the following rule.

When the priority $\{p_i\}$ of the state transition having the smaller bit number of the two priorities $\{p_i\}$ that are input is 1, each of the plurality of selectors supplies 1 as the priority $\{p_i\}$ to a selector in the next stage. Each of the plurality of selectors supplies 1 as the priority $\{p_i\}$ to a selector in the next stage, when the priority $\{p_i\}$ of the state transition having the larger bit number of the two priorities $\{p_i\}$ that are input is 1 and the transition acceptance $\{f_i\}$ of the state transition having the larger bit number is 1.

On the other hand, each of the plurality of selectors supplies 0 as the priority $\{p_i\}$ to a selector in its next stage, when the priority $\{p_i\}$ of the state transition having the larger bit number of the two priorities $\{p_i\}$ that are input is 1 and the transition acceptance $\{f_i\}$ of the state transition having the larger bit number is 0. In this case, of two selectors coupled to the same selector in the next stage, the selector located at the right side of the binary tree structure supplies a signal to set the priority $\{p_i\}$ of the state transition with the smaller bit number to 1 to the selector right adjacent to the selector in the next stage. Hereinafter, the signal will be referred to as a priority transmission signal. When there is no selector right adjacent to the selector in the next stage, the priority transmission signal is not supplied.

In the example illustrated in FIG. 1, it is assumed that the transition acceptances $f_8$ and $f_{15}$ are 1, the transition acceptances $f_9$ to $f_{14}$ are 0, and the priority $p_{11}$ is 1 among the transition acceptances $f_8$ to $f_{15}$. At this time, according to the rule described above, the transition acceptance $f_8$, the bit number, and the priority=0 of the state transition with the bit number 8 among the state transitions with the bit numbers 8 to 11 are output from a selector in the second stage. On the other hand, according to the rule described above, the transition acceptance $f_{15}$, the bit number, the priority=1 of the state transition with the bit number 15 among the state transitions of the bit numbers 12 to 15 are output from the selector right adjacent to the selector described above in the second stage. When the priority transmission signal is not used, a selector in a third stage to which the transition acceptance $f_8$ and the transition acceptance $f_{15}$ are input outputs the transition acceptance $f_8$ and the bit number of the state transition with the bit number=8 having a lower priority order than the state transition with the bit number=15. By contrast, by using the priority transmission signal, the selector in the third stage may output the transition acceptance $f_{15}$ and the bit number of the state transition with the bit number=15 having a higher priority order than the state transition with the bit number=8, because the priority input from the upper right selector is 1.

Such a transition acceptance selection circuit 24c sequentially select a state transition which becomes a transition candidate preferentially from a smaller bit number.

The transition acceptance selection circuit 24c may sequentially select a state transition which becomes a transition candidate preferentially from a larger bit number. In this case, the following processing is performed. The transition acceptance selection circuit 24c minimizes the priority order of the state transition whose state variable which has undergone the previous transition is transited again, and maximizes the priority order of the state transition whose bit number is one smaller than that of the state transition which has undergone the previous transition. As for the state transition whose bit number is smaller than the bit number of the state transition whose priority order is the highest, the transition acceptance selection circuit 24c lowers the priority order as the bit number becomes smaller. The transition acceptance selection circuit 24c makes the priority order of the state transition having the maximum bit number one lower than the priority order of the state transition having the minimum bit number. As for the state transition whose bit number is larger than the bit number of the state transition whose priority order is the lowest, the transition acceptance selection circuit 24c lowers the priority order as the bit number becomes smaller.

The above rule may be achieved by using the priority $\{p_i\}$ having one bit for each bit number and the plurality of selectors arranged in the binary tree structure, as in the case of selecting a state transition which becomes a transition candidate preferentially from a lower bit number. For example, the transition acceptance selection circuit 24c sets the priority $\{p_i\}$ of the state transition with a bit number one smaller than the update bit number to 1, and sets the priority $\{p_i\}$ of the state transition of each of the other bit numbers to 0.

When one of the transition acceptances $\{f_i\}$ of the two state transitions that are input is 1, each of the plurality of selectors arranged in the binary tree structure outputs the transition acceptance $\{f_i\}$ and the bit number of the state transition whose transition acceptance $\{f_i\}$ is 1. On the other hand, each of the plurality of selectors arranged in the binary tree structure outputs the transition acceptance $\{f_i\}$ and the bit number of the state transition having a smaller bit number, when both of the transition acceptances $\{f_i\}$ of the two state transitions that are input are 1 and the priority $\{p_i\}$ of the state transition having the smaller bit number is 1. Otherwise, each of the plurality of selectors outputs the transition acceptance $\{f_i\}$ and the bit number of the state transition having a larger bit number.

When a state transition which becomes a transition candidate is sequentially selected preferentially from the larger bit number, each of the plurality of selectors arranged in the binary tree structure propagates the priority $\{p_i\}$ to the next stage in accordance with the following rule.

When the priority $\{p_i\}$ of the state transition having the larger bit number among the two priorities $\{p_i\}$ that are input is 1, each of the plurality of selectors supplies 1 as the priority $\{p_i\}$ to a selector in the next stage. Each of the plurality of selectors supplies 1 as the priority $\{p_i\}$ to a selector in the next stage, when the priority $\{p_i\}$ of the state transition having the smaller bit number of the two priorities $\{p_i\}$ that are input is 1 and the transition acceptance $\{f_i\}$ of the state transition having the smaller bit number is 1.

On the other hand, each of the plurality of selectors supplies 0 as the priority $\{p_i\}$ to a selector in its next stage, when the priority $\{p_i\}$ of the state transition having the smaller bit number of the two priorities $\{p_i\}$ that are input is 1 and the transition acceptance $\{f_1\}$ of the state transition having the smaller bit number is 0. In this case, of the two selectors coupled to the same selector in the next stage, the selector located at the left side of the binary tree structure supplies the priority transmission signal to set the priority $\{p_i\}$ of the state transition having the larger bit number to 1 to the selector left adjacent to the selector in the next stage. When there is no selector left adjacent to the selector in the next stage, the priority transmission signal is not supplied.

The transition acceptance selection circuit 24c may sequentially select a state transition from a bit number between a minimum bit number and a maximum bit number rather than from the minimum bit number or the maximum bit number, to a smaller bit number or a larger bit number.

An example of generating the priority $\{p_i\}$ and a circuit example of the transition acceptance selection circuit 24c will be described later.

When there is no allowed state transition, the transition control unit 24 may add or subtract an offset value to or from one of the energy change $\{-\Delta E_i\}$ or $Tf^{-1}(u)$ such that the acceptance probability of the state transition increases (see, for example, Japanese Laid-open Patent Publication No. 2018-063626).

The energy comparison unit 25 outputs the lowest energy state S which is values of a plurality of state variables when energy to be updated based on the state transition selected by the transition control unit 24 is updated a plurality of times and becomes the lowest value during being updated. For example, each time the state s is updated, the energy comparison unit 25 calculates energy of the current state s by using the state s, the weight coefficient, and a bias value. The energy comparison unit 25 holds the lowest energy and a state (the lowest energy state S) when the lowest energy is obtained. The energy comparison unit 25 updates the lowest energy when the energy obtained from the current state s is lower than the lowest energy so far, and stores the state s as the lowest energy state S. The energy comparison unit 25 outputs the lowest energy state S when the energy becomes the lowest value during being updated the plurality of times, as a solution of the combinatorial optimization problem. Such an energy comparison unit 25 may be implemented by using, for example, a product-sum operation circuit, a comparator, a register or a memory (for example, RAM), and the like. When the evaluation function calculation unit 22 calculates the energy itself, the energy comparison unit 25 may receive energy from the evaluation function calculation unit 22, and may not calculate the energy on its own.

In a case where the state s after the processing for updating the state s is performed a predetermined number of times is output as a result of optimization, the energy comparison unit 25 may not be used.

Hereinafter, an operation example of the optimization device 20 will be described.

Figure 2:
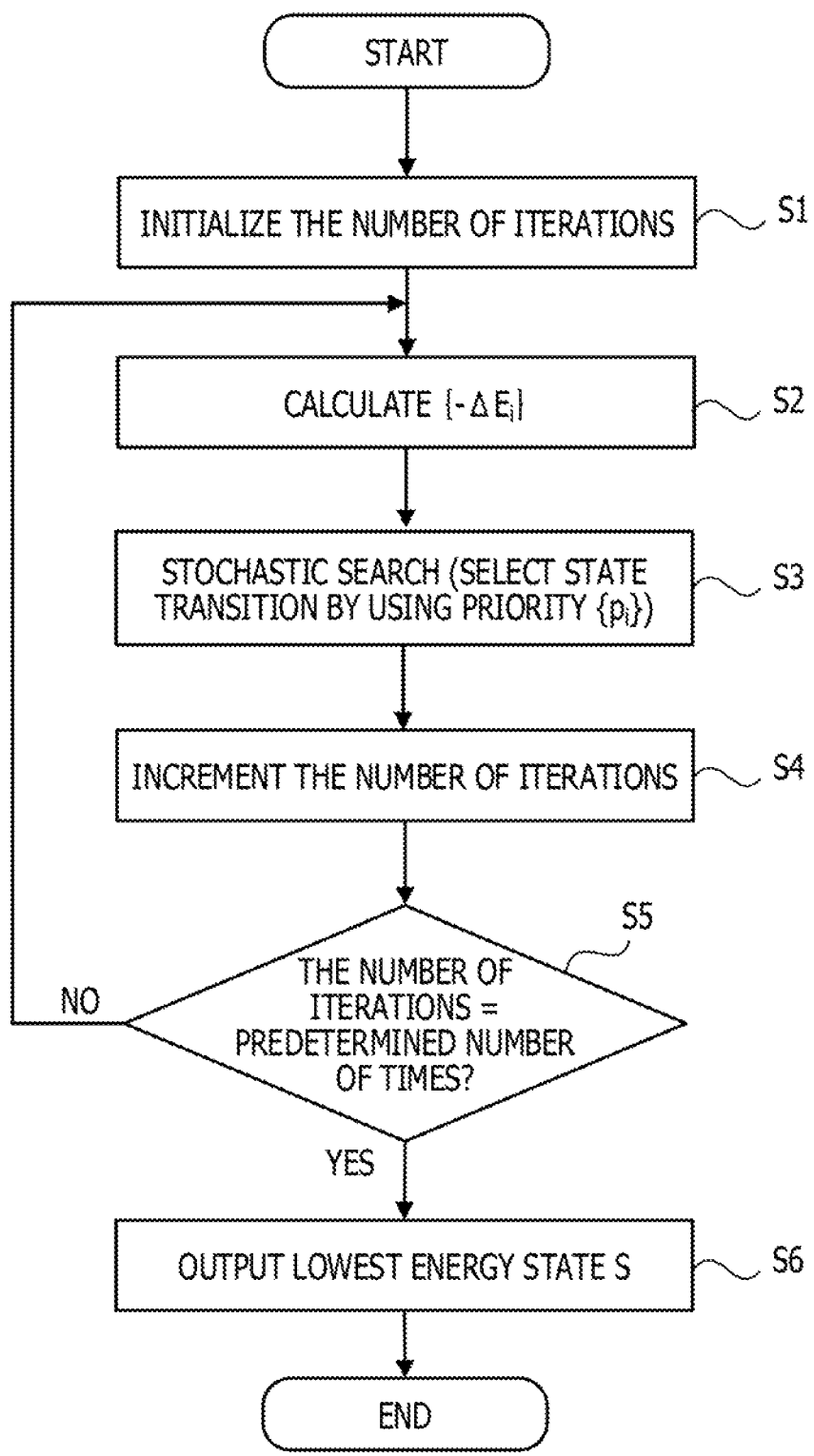
FIG. 2 is a flowchart illustrating an example of an operation procedure by an optimization device.

FIG. 2 is a flowchart illustrating an example of an operation procedure by an optimization device.

First, in the optimization device 20, the number of iterations is initialized by a control unit (controller) (not illustrated) that manages the number of iterations (step S1). Then, the energy change $\{-\Delta E_i\}$ is calculated by the processing of the evaluation function calculation unit 22 described above (step S2).

Stochastic search is performed (step S3). The stochastic search includes the aforementioned processing for determining the transition acceptance $\{f_i\}$ and selecting a state transition as a transition candidate by using the priority $\{p_i\}$ in addition to the transition acceptance $\{f_i\}$, and processing for updating the priority $\{p_i\}$, as described above, by the transition control unit 24. The stochastic search also includes processing for updating the state variable based on the transition acceptance F and the transition number N by the state holding unit 21.

Thereafter, the control unit increments the number of iterations (step S4), and determines whether or not the number of iterations reaches a predetermined number of times (step S5). When the repetition number does not reach the predetermined number of times, the process from step S2 is repeated, and when the number of iterations reaches the predetermined number of times, the control unit causes the energy comparison unit 25 to output the lowest energy state S (step S6), and ends the processing. In order to enable the simulated annealing method, the temperature control unit 23 performs control to lower the temperature T each time the number of iterations reaches a certain number of times (less than the predetermined number of times), although the process is not illustrated in FIG. 2. For this reason, the temperature control unit 23 may perform the processing of the control unit (controller) that manages the number of iterations.

When selecting a transition candidate from among the plurality of state transitions, the optimization device 20 selects the transition candidate based on the priority information instead of randomly selecting the transition candidate, thereby enabling search that sequentially selects the state transition in the order of the bit numbers. Accordingly, it is possible to solve, at high speed, a combinatorial optimization problem for which the search that sequentially selects a state transition which becomes a transition candidate, such as a maximum cut problem, a traveling salesman problem, a spin glass problem, or the like is appropriate.

Various simulation results are represented below.

Figure 3:
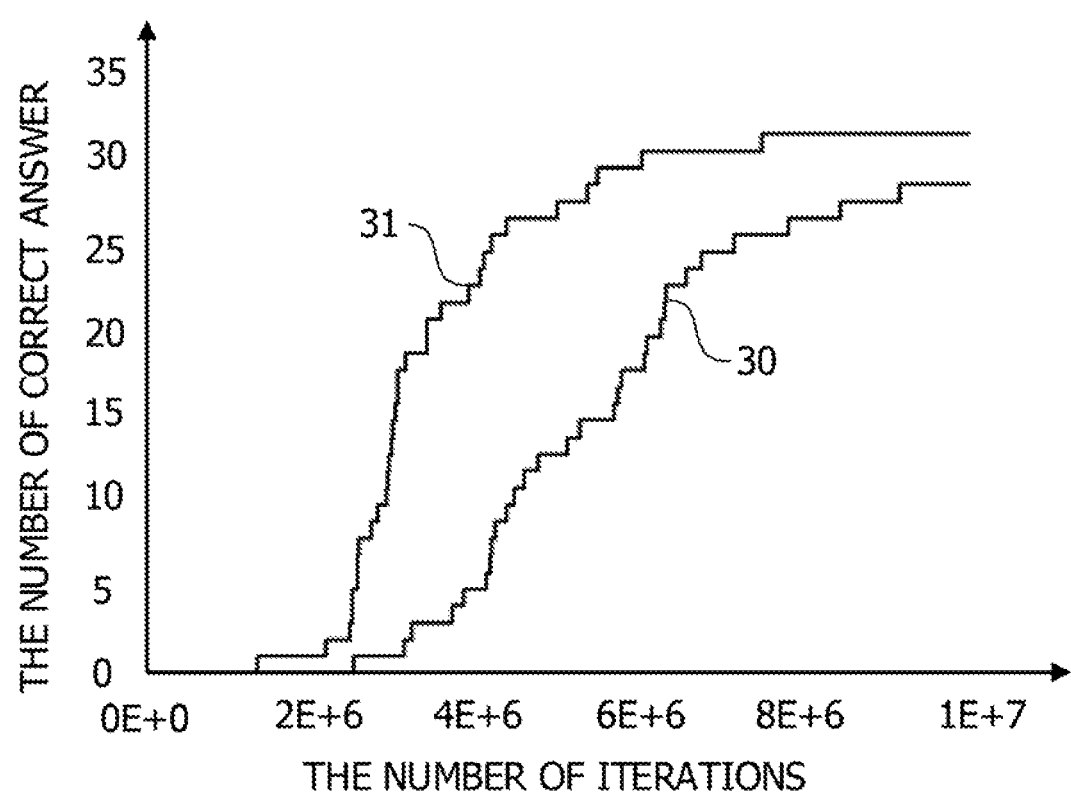
FIG. 3 is a diagram illustrating an example of a simulation result for which a state transition to be a transition candidate is sequentially or randomly selected without performing parallel search to calculate a maximum cut problem.

FIG. 3 is a diagram illustrating an example of a simulation result for which a state transition to be a transition candidate is sequentially or randomly selected without performing parallel search to calculate a maximum cut problem. The horizontal axis represents the number of iterations, and the vertical axis represents the number of correct answers. The maximum cut problem to be calculated is a 1000 bit scale problem, such as Maxcut (G43).

In FIG. 3, a result 30 indicates a calculation result when a state transition that becomes a transition candidate is randomly selected, and a result 31 indicates a calculation result when a state transition that becomes a transition candidate state is sequentially selected. From the results 30 and 31, it may be seen that the number of correct answers increases at about two times faster when the state transition that becomes the transition candidate is sequentially selected than when the state transition that becomes the transition candidate is randomly selected.

Figure 4:
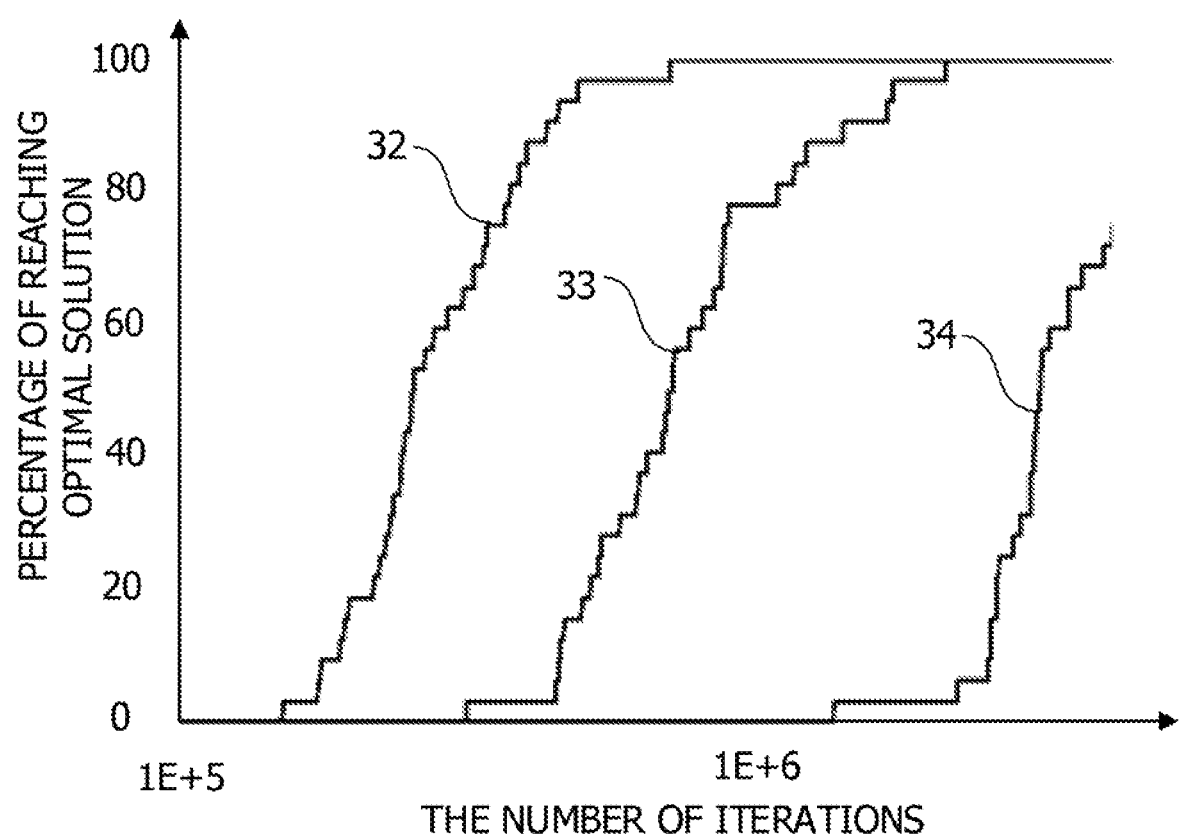
FIG. 4 is a diagram illustrating an example of simulation results for which parallel search is performed and a state transition that becomes a transition candidate is sequentially or randomly selected to calculate a maximum cut problem.

FIG. 4 is a diagram illustrating an example of simulation results for which parallel search is performed and a state transition that becomes a transition candidate is sequentially or randomly selected to calculate a maximum cut problem.

Figure 5:
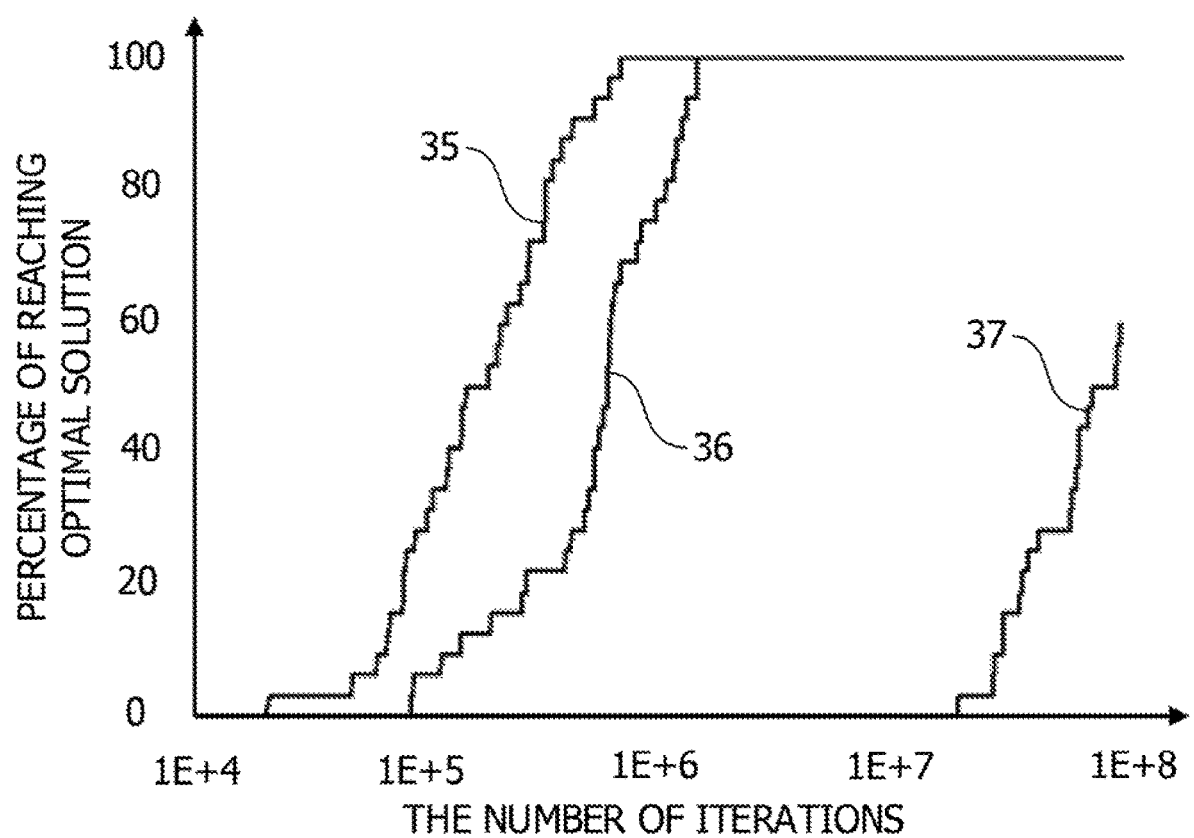
FIG. 5 is a diagram illustrating an example of simulation results for which parallel search is performed and a state transition that becomes a transition candidate is sequentially or randomly selected to calculate a traveling salesman problem.

FIG. 5 is a diagram illustrating an example of simulation results for which parallel search is performed and a state transition which becomes a transition candidate is sequentially or randomly selected to calculate a traveling salesman problem.

In both FIG. 4 and FIG. 5, the horizontal axis represents the number of iterations, and the vertical axis represents a percentage of reaching an optimal solution. The maximum cut problem to be calculated is Maxcut (G43), and the number of cities in the traveling salesman problem to be calculated is 32 cities.

In FIG. 4 and FIG. 5, results 32 and 35 represent calculation results when the parallel search is performed and a state transition that becomes a transition candidate is sequentially selected, and results 33 and 36 represent calculation results when the parallel search is performed and a state transition that becomes a transition candidate is randomly selected. In FIG. 4 and FIG. 5, for purposes of comparison, results 34 and 37 obtained by calculating the maximum cut problem or the traveling salesman problem by sequentially selecting a state transition that becomes a transition candidate without performing the parallel search are illustrated.

From FIG. 4 and FIG. 5, it may be seen that a rate of increase in percentage of reaching an optimal solution in a case where the parallel search is performed and the state transition is sequentially selected as in the optimization device 20 in FIG. 1 is about two times faster than that in a case where the parallel search is performed and the state transition is randomly selected. From FIG. 4 and FIG. 5, it may be seen that the rate of increase in percentage of reaching an optimal solution in the case where the parallel search is performed and the state transition is sequentially selected as in the optimization device 20 in FIG. 1 is about 10 to 100 times faster than that in a case where the state transition is sequentially selected without performing the parallel search.

Example of Transition Acceptance Selection Circuit 24c

Figure 6:
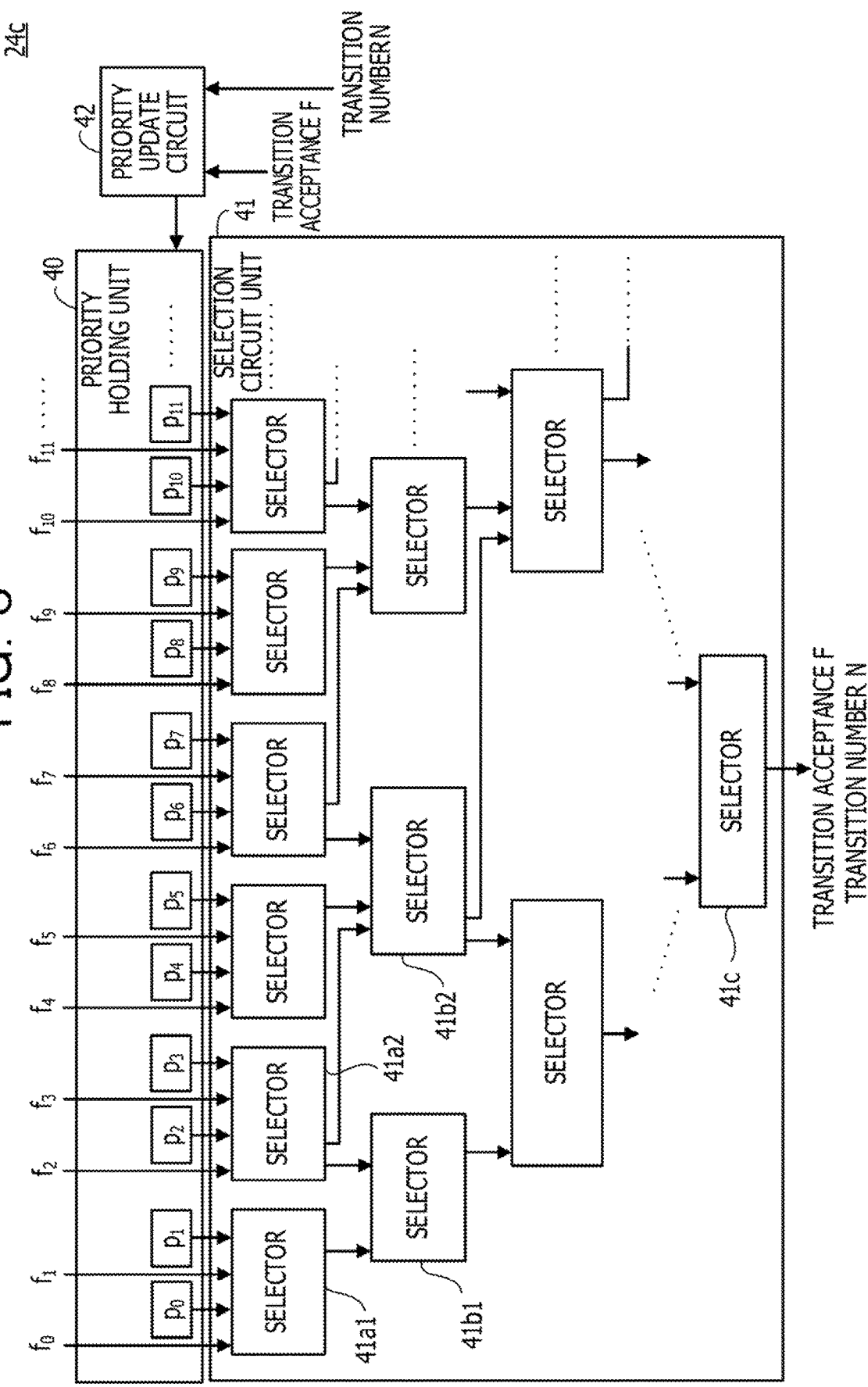
FIG. 6 is a diagram illustrating an example of a transition acceptance selection circuit.

FIG. 6 is a diagram illustrating an example of a transition acceptance selection circuit. Although, in the following description, a case where the transition acceptance selection circuit 24c selects a state transition that becomes a transition candidate preferentially from a smaller bit number will be described, a case where a state transition is selected preferentially from a larger bit number may be also implemented by using substantially the same circuit.

The transition acceptance selection circuit 24c includes a priority holding unit 40, a selection circuit unit 41, and a priority update circuit 42.

The priority holding unit 40 holds the priority $\{p_i\}$ set for each bit number. The priority holding unit 40 includes, for example, a plurality of registers holds the priority $\{p_i\}$ having one bit for each bit number.

The selection circuit unit 41 includes a plurality of selectors (selectors 41a1, 41a2, 41b1, 41b2, 41c, and the like) which are arranged in a plurality of stages in a binary tree structure. Each of the plurality of selectors receives the transition acceptances $\{f_i\}$ of two state transitions and the priorities $\{p_i\}$ set for the bit numbers of the two state transitions are input, and receives addresses corresponding to the bit numbers output from the two selectors in the previous stage except for the selectors in the first stage. Among the selectors in the second and subsequent stages, the selectors other than the selector in the last stage and the selector at the left end in each stage receive the priority transmission signal described above. Each of the plurality of selectors outputs the transition acceptance $\{f_i\}$, the priority $\{p_i\}$, and the address corresponding to the bit number based on the transition acceptances $\{f_i\}$ and the priorities $\{p_i\}$ of the two state transitions that are input, and the priority transmission signal. Of the two selectors coupled to the same selector in the next stage, the selector located at the right side of the binary tree structure supplies the priority transmission signal to the selector right adjacent to the selector in the next stage.

For example, when one of the transition acceptances {$f_i$} (transition acceptances $f_2$, $f_3$) of the two state transitions that are input is 1, the selector 41a2 outputs the transition acceptance {$f_i$} of the state transition whose transition acceptance {$f_i$} is 1 and the address (0 or 1) corresponding to the bit number. On the other hand, when both of the transition acceptances $f_2$ and $f_3$ are 1 and the priority {$p_i$} (priority $p_3$) having the larger bit number is 1, the selector 41a2 outputs the transition acceptance $f_3$ and the address corresponding to the bit number (for example, 1). Otherwise, the selector 41a2 outputs the transition acceptance $f_2$ of the state transition having the smaller bit number and the address corresponding to the bit number (for example, 0).

When the priority $p_2$ of the state transition having the smaller bit number of the two priorities $p_2$ and $p_3$ that are input is 1, the selector 41a2 supplies 1 as the priority to the selector 41b1 in the next stage. When the priority $p_3$ of the state transition having the larger bit number of the priorities $p_2$ and $p_3$ is 1 and the transition acceptance $f_3$ of the state transition is 1, the selector 41a2 supplies 1 as priority to the selector 41b1 in the next stage. On the other hand, when the priority $p_3$ of the state transition having the larger bit number of the priorities $p_2$ and $p_3$ is 1 and the transition acceptance $f_3$ of the state transition is 0, the selector 41a2 supplies 0 as the priority to the selector 41b1 in the next stage. In this case, the selector 41a2 supplies the priority transmission signal to set the priority of the state transition having the smaller bit number to 1 to the selector 41b2 right adjacent to the selector 41b1 in the next stage.

A bit width of the address corresponding to the bit number increases one bit each time the address passes through the selector in each stage, and the address output from the selector 41c in the last stage becomes the bit number of the selected state transition, namely, the transition number N. The transition acceptance {$f_i$} output from the selector 41c in the last stage becomes the transition acceptance F. The selector 41c in the last stage does not have to output the priority.

The priority update circuit 42 updates the priority {$p_i$} based on the transition acceptance F and the transition number N. When the transition acceptance F is 1, the priority update circuit 42 changes the priority {$p_i$} of the state transition having the bit number one larger than the transition number N from 0 to 1, and changes the priority {$p_i$} which has been 1 to 0. When the transition acceptance F is 0, the priority update circuit 42 does not change the priority {$p_i$}. The priority update circuit 42 for performing such updating may be implemented by using an inverter circuit or the like.

Figure 7:
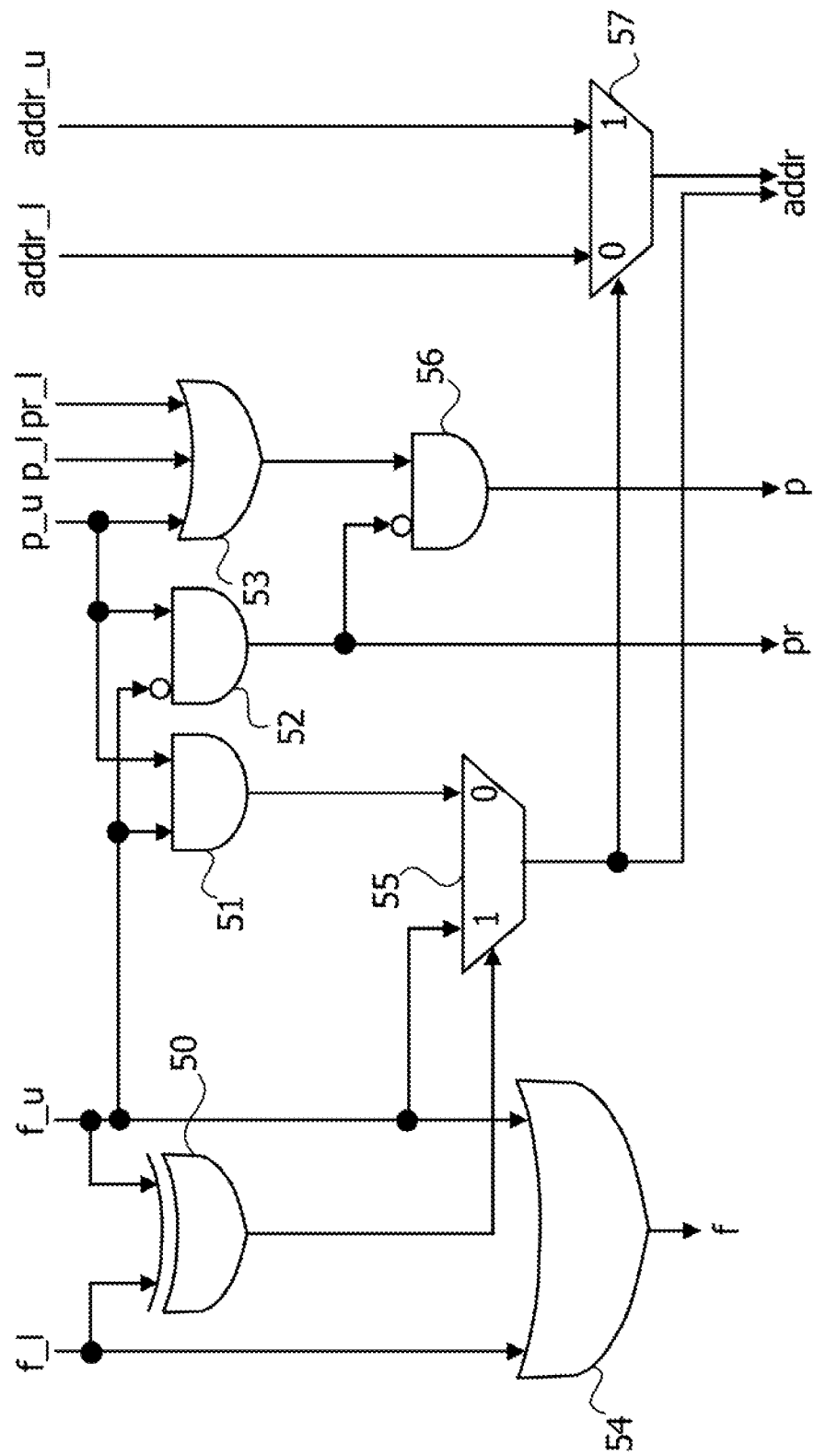
FIG. 7 is a diagram illustrating an example of a selector of a selection circuit unit.

FIG. 7 is a diagram illustrating an example of a selector of a selection circuit unit. FIG. 7 illustrates an example of the selector 41b2 in the second stage illustrated in FIG. 6.

The selector 41b2 includes an XOR (exclusive logical sum) circuit 50, AND (logical product) circuits 51 and 52, an OR (logical sum) circuits 53 and 54, a 2:1 selector 55, an AND circuit 56, and a 2:1 selector 57.

The XOR circuit 50 is input transition acceptances f_l and f_u output from two selectors in the previous stage. Of the transition acceptances f_l and f_u, the transition acceptance f_l is a transition acceptance of a state transition having a smaller bit number, and the transition acceptance f_u is a transition acceptance of a state transition having a larger bit number. The XOR circuit 50 outputs 0 when the values of the transition acceptances f_l and f_u coincide with each other, and outputs 1 when the value of the transition acceptance f_l is different from the value of the transition acceptance f_l.

The AND circuit 51 receives the transition acceptance f_u and a priority p_u, and outputs a logical product of the transition acceptance f_u and the priority p_u. The priority p_u is priority set for a larger bit number of priorities p_l and p_u output from the two selectors in the previous stage.

The AND circuit 52 receives a value obtained by inverting the transition acceptance f_u, and the priority p_u, and outputs a priority transmission signal pr which is a logical product of the value obtained by inverting the transition acceptance f_u and the priority p_u.

The OR circuit 53 receives the priorities p_l and p_u and a priority transmission signal pr_l output from the selector 41a2, and outputs a logical sum of the priorities p_l and p_u and the priority transmission signal pr_l.

The OR circuit 54 receives the transition acceptances f_l and f_u, and outputs a transition acceptance (denoted as f) which is a logical sum of the transition acceptances f_l and f_u.

The 2:1 selector 55 receives the transition acceptance f_u and the value of 0 or 1 output from the AND circuit 51. When the output of the XOR circuit 50 is 1, the 2:1 selector 55 selects and outputs the value of the transition acceptance f_u, and when the output of the XOR circuit 50 is 0, the 2:1 selector 55 selects and outputs the value output from the AND circuit 51.

The AND circuit 56 receives a value obtained by inverting the output (priority transmission signal pr) of the AND circuit 52 and the value of 0 or 1 output from the OR circuit 53. The AND circuit 56 outputs a priority (denoted as p) which is a logical product of the value obtained by inverting the priority transmission signal pr and the value output from the OR circuit 53.

The 2:1 selector 57 receives addresses addr_l and addr_u corresponding to the bit numbers output from the two selectors in the previous stage. Of the addresses addr_l and addr_u, the address addr_l is an address corresponding to the smaller bit number, and the address addr_u is an address corresponding to the larger bit number. The 2:1 selector 57 selects and outputs the address addr_l when the output of the 2:1 selector 55 is 0, and selects and outputs the address addr_u when the output of the 2:1 selector 55 is 1. An address addr output from the selector 41b2 is an address obtained by adding the value having one bit output from the 2:1 selector 55 to the address addr_l or addr_u output from the 2:1 selector 55 (added to the upper bit).

The other selectors illustrated in FIG. 6 may also be implemented by substantially the same circuit configuration as that of the selector 41b2 illustrated in FIG. 7. However, the selectors in the first stage are not provided with the 2:1 selector 57 illustrated in FIG. 7, and the priority transmission signal pr_l is not input to the OR circuit 53. A selector that is the selector located at the left side of the binary tree structure or the selector located at the right side of the two selectors coupled to the same selector in the next stage, but that does not have a selector at the right adjacent to the selector in the next stage does not output the priority transmission signal pr. The AND circuits 52 and 56 and the OR circuit 53 may not be provided in the selector 41c in the last stage.

The optimization device 20 according to the first embodiment may be provided by using the transition acceptance selection circuit 24c of the circuit configuration as described above, for example.

Second Embodiment

Figure 8:
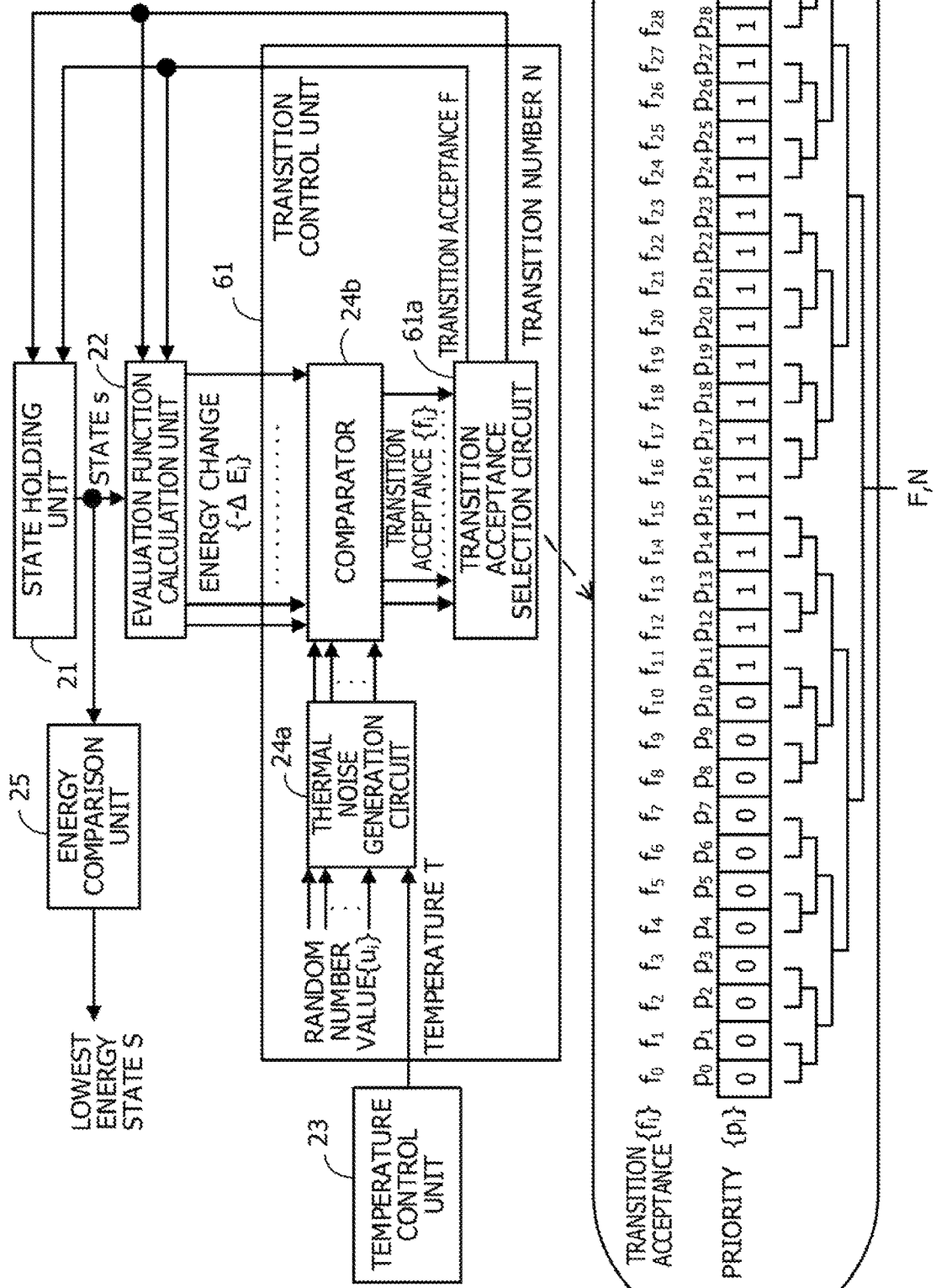
FIG. 8 is a diagram illustrating an example of an optimization device according to a second embodiment.

FIG. 8 is a diagram illustrating an example of an optimization device according to a second embodiment. In FIG. 8, the same components as those of the optimization device 20 illustrated in FIG. 1 are assigned the same reference signs.

In an optimization device 60 according to the second embodiment, a transition acceptance selection circuit 61a of a transition control unit 61 is different from the transition acceptance selection circuit 24c of the transition control unit 24 in the optimization device 20 according to the first embodiment.

The transition acceptance selection circuit 61a sets the priorities $\{p_i\}$ of the state transitions having the bit numbers which are larger than the bit number (update bit number) for identifying the state transition which has been updated last time among the plurality of bit numbers (the state variable which has undergone the previous transition) to 1. The transition acceptance selection circuit 61a sets the priorities $\{p_i\}$ of the state transitions having the bit numbers equal to and smaller than the update bit number to 0.

FIG. 8 illustrates an example of the priorities $\{p_i\}$ ($p_0$ to $p_{31}$) set for the 32 state transitions in a case where the update bit number is 10. As illustrated in FIG. 8, the state transitions whose bit numbers are larger than 10 are set to 1 as the priorities $p_{11}$ to $p_{31}$, and the state transitions having the other bit numbers are set to 0 as the priorities $p_0$ to $p_{10}$. 0 and 1 may be set to be opposite to each other.

The transition acceptance selection circuit 61a includes a plurality of selectors arranged in a binary tree structure, similarly to the transition acceptance selection circuit 24c according to the first embodiment.

When one of the transition acceptances $\{f_i\}$ of the two state transitions that are input is 1, each of the plurality of selectors arranged in the binary tree structure outputs the transition acceptance $\{f_i\}$, the priority $\{p_i\}$ and the bit number of the state transition whose transition acceptance $\{f_i\}$ is 1. On the other hand, in a case where both of the transition acceptances $\{f_i\}$ of the two state transitions that are input are the same value, each of the plurality of selectors arranged in the binary tree structure outputs the transition acceptance $\{f_i\}$, the priority $\{p_i\}$, and the bit number of the state transition having the smaller bit number when the priorities $\{p_i\}$ are the same value. Each of the plurality of selectors arranged in the binary tree structure outputs the transition acceptance $\{f_i\}$, the priority $\{p_i\}$, and the bit number of the state transition having the larger bit number (the state transition with the priority $\{p_i\}$ being 1), when the priorities $\{p_i\}$ are different from each other.

Similarly to the transition acceptance selection circuit 24c according to the first embodiment, such a transition acceptance selection circuit 61a sequentially selects a state transition which becomes a transition candidate preferentially from a smaller bit number.

The transition acceptance selection circuit 61a may sequentially select a state transition which becomes a transition candidate preferentially from a larger bit number. In this case, the following processing is performed. The transition acceptance selection circuit 61a minimizes the priority order of the state transition whose state variable which has undergone the previous transition is transited again, and maximizes the priority order of the state transition whose bit number is one smaller than that of the state transition which has undergone the previous transition. As for the state transition whose bit number is smaller than the bit number of the state transition whose priority order is the highest, the transition acceptance selection circuit 61a lowers the priority order as the bit number becomes smaller. The transition acceptance selection circuit 61a makes the priority order of the state transition having the maximum bit number one lower than the priority order of the state transition having the minimum bit number. As for the state transition whose bit number is larger than the bit number of the state transition whose priority order is the lowest, the transition acceptance selection circuit 61a lowers the priority order as the bit number becomes smaller.

The above rule may be achieved by using the priority $\{p_i\}$ having one bit for each bit number and the plurality of selectors arranged in the binary tree structure, as in the case of selecting a state transition which becomes a transition candidate preferentially from a lower bit number. For example, the transition acceptance selection circuit 61a sets the priorities $\{p_i\}$ of the state transitions having the bit numbers smaller than the update bit number to 1, and sets the priorities $\{p_i\}$ of the state transitions having the other bit numbers to 0. In a case where both of the transition acceptances $\{f_i\}$ of the two state transitions that are input are the same value, each of the plurality of selectors arranged in the binary tree structure outputs the transition acceptance $\{f_i\}$, the priority $\{p_i\}$, and the bit number of the state transition having the larger bit number when the priorities $\{p_i\}$ are the same value. Each of the plurality of selectors arranged in the binary tree structure outputs the transition acceptance $\{f_i\}$, the priority $\{p_i\}$, and the bit number of the state transition having the smaller bit number (the state transition with the priority $\{p_i\}$ being 1), when the priorities $\{p_i\}$ are different from each other.

The transition acceptance selection circuit 61a may sequentially select a state transition from a bit number between a minimum bit number and a maximum bit number rather than from the minimum bit number or the maximum bit number, to a smaller bit number and a larger bit number.

Figure 9:
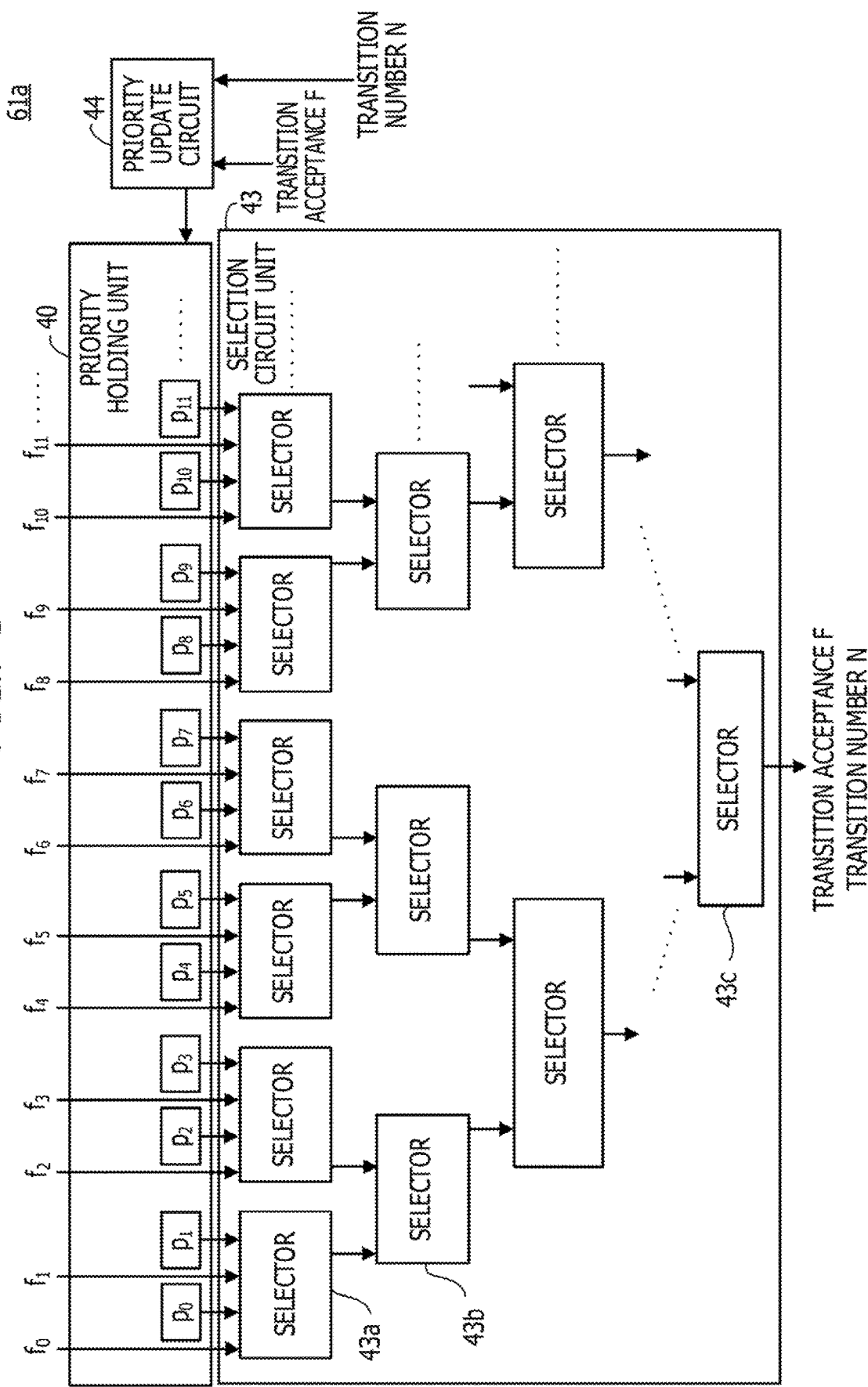
FIG. 9 is a diagram illustrating an example of a transition acceptance selection circuit.

FIG. 9 is a diagram illustrating an example of a transition acceptance selection circuit. In FIG. 9, the same components as those of the transition acceptance selection circuit 24c illustrated in FIG. 6 are assigned the same reference signs. Although, in the following description, a case where the transition acceptance selection circuit 61a selects a state transition that becomes a transition candidate preferentially from a smaller bit number will be described, a case where a state transition is selected preferentially from a larger bit number may be also implemented by using substantially the same circuit.

A selection circuit unit 43 includes a plurality of selectors (selectors 43a, 43b, 43c, and the like) arranged in a plurality of stages in a binary tree structure. Each of the plurality of selectors receives the transition acceptances $\{f_i\}$ of two state transitions and the priorities $\{p_i\}$ set for the bit numbers of the two state transitions are input, and receives addresses corresponding to the bit numbers output from the two selectors in the previous stage except for the selectors in the first stage. When one of the transition acceptances $\{f_i\}$ of the two state transitions that are input is 1, each of the plurality of selectors outputs the transition acceptance $\{f_i\}$, the priority $\{p_i\}$, and an address corresponding to the bit number, of the state transition whose transition acceptance $\{f_i\}$ is 1. On the other hand, when both of the transition acceptances $\{f_i\}$ of the two state transitions that are input are the same value, each of the plurality of selectors outputs the transition acceptance $\{f_i\}$, the priority $\{p_i\}$, and an address corresponding to the bit number, of the state transition having the smaller bit number when the priorities $\{p_i\}$ are the same value.

For example, the selector 43a in a first stage receives the transition acceptances $f_0$ and $f_1$ and the priorities $p_0$ and $p_1$ of two state transitions whose bit numbers are adjacent to each other. When one of the transition acceptances $f_0$ and $f_{1\ is}$ 1, the selector 43a outputs the transition acceptance $\{f_i\}$, the priority {$p_i$}, and an address having one bit (0 or 1) and corresponding to the bit number, of the state transition whose transition acceptance $f_0$ or $f_1$ is 1. On the other hand, when both of the transition acceptances $f_0$ and $f_1$ are the same value, the selector 43a outputs the transition acceptance {$f_i$}, the priority {$p_i$}, and the address, that is, the transition acceptance $f_0$, the priority $p_0$, and 0, of the state transition having the smaller bit number when the priorities $p_0$ and $p_1$ are the same value. When the priorities $p_0$ and $p_1$ are different from each other, the selector 43a outputs the transition acceptance {$f_i$}, the priority {$p_i$} and the address, that is, the transition acceptance $f_1$, the priority $p_1$, and 1, of the state transition having the large bit number.

A bit width of the address corresponding to the bit number increases one bit each time the address passes through the selector in each stage, and the address output from the selector 43c in the last stage becomes the bit number of the selected state transition, namely, the transition number N. The transition acceptance {$f_i$} output from the selector 43c in the last stage becomes the transition acceptance F. The selector 43c in the last stage does not have to output the priority {$p_i$}.

A priority update circuit 44 updates the priority {$p_i$} based on the transition acceptance F and the transition number N. As a method for updating the priority {$p_i$}, there are the following two methods, for example.

Priority {$p_i$} Update Method Example 1

The priority update circuit 44 updates the priority {$p_i$} based on a comparison result between the bit number (update bit number) of the state variable which has undergone the previous transition and the bit number of each state variable.

The priority update circuit 44 sets the transition number N when the transition acceptance F is "1" as the update bit number $N_{update}$. The priority update circuit 44 sets the priority $p_i$ set for the bit number $N_i$ where the bit number $N_i > N_{update}$ is satisfied to 1, and sets the priority $p_i$ set for the bit number $N_i$ where the bit number $N_i \leq N_{update}$ is satisfied to 0.

The priority update circuit 44 that performs such updating may be implemented by using a comparison circuit or the like.

Priority {$p_i$} Update Method Example 2

In the priority update circuit 44 that performs a priority {$p_i$} update method example 2, a circuit that sets the priority {$p_i$} set for each bit number to the same value as the priority set for the bit number which is one smaller than each bit number is used. The priority update circuit 44 forcibly sets the priority set for the bit number which is one larger than the bit number of the state variable which has undergone the previous transition to 1. At this time, all the priorities of the bit numbers larger than the bit number whose priority is set to 1 are set to 1 by the circuit described above.

Figure 10:
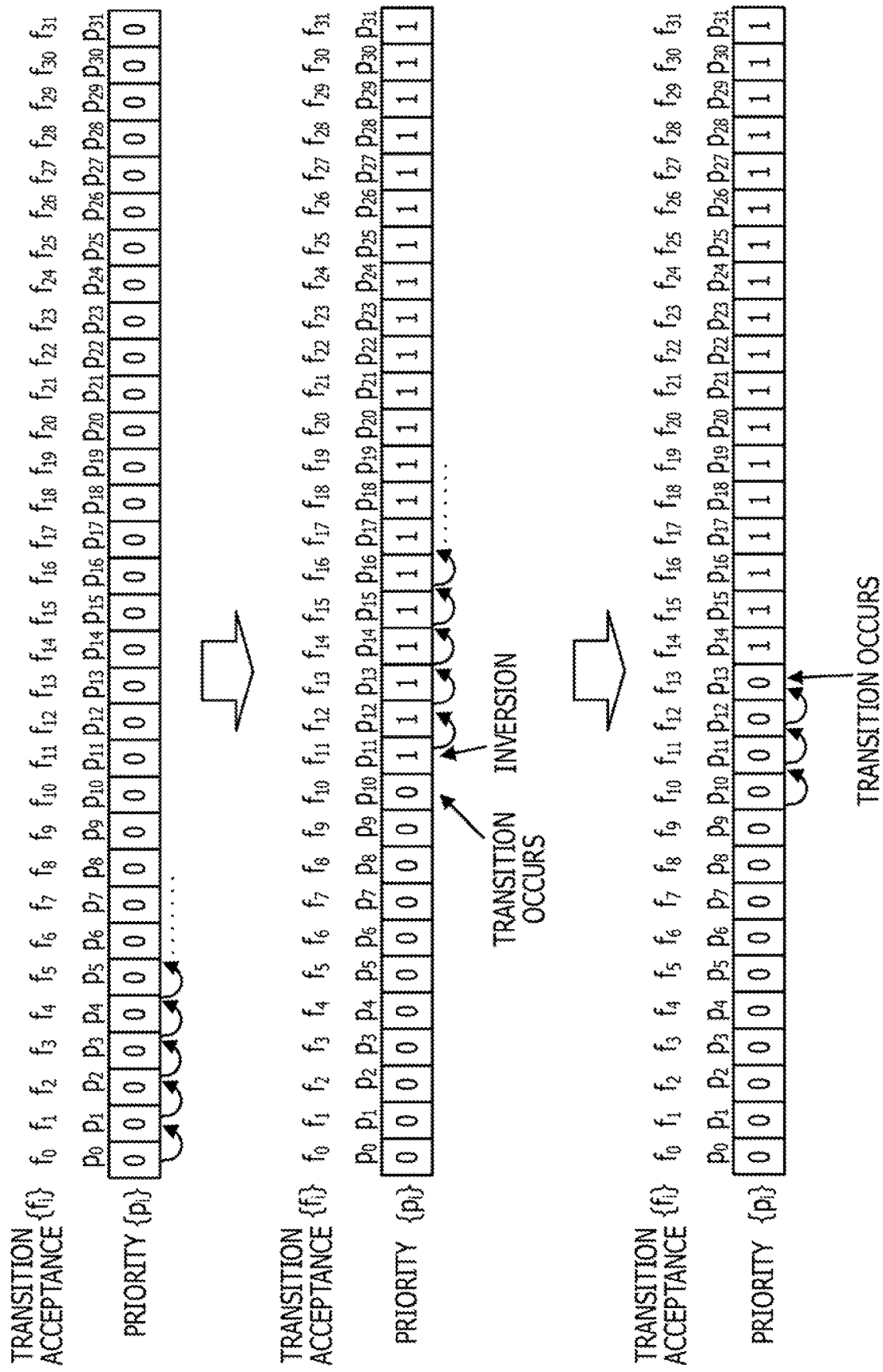
FIG. 10 is a diagram illustrating an example of updating priority.

FIG. 10 is a diagram illustrating an example of updating priority.

In an initial state, all the priorities {$p_i$} are 0 due to the value=0 of the priority $p_0$ set for the minimum bit number. When a transition in the state variable having the bit number=10 occurs, the priority update circuit 44 forcibly inverts the priority $p_{11}$ set for the bit number=11 to 1. The priority update circuit 44 sets the priorities {$p_i$} that are set for the bit numbers larger than the bit number=11 to 1 by the circuit which sets the priority {$p_i$} to the same value as the priority set for the bit number which is one smaller than each bit number. Then, when a transition in the state variable having the bit number=13 occurs, the priority update circuit 44 maintains the priority $p_{14}$ set for the bit number=14 at 1. The priority update circuit 44 inverts the priorities $p_{11}$ to $p_{13}$ which have been inverted to 1 to 0 by the circuit which sets the priority {$p_i$} to the same value as the priority set for the bit number which is one smaller than each bit number.

The priority update circuit 44 that performs such processing may be implemented by using, for example, an OR circuit provided corresponding to each bit number or the like. A priority of a bit number $N_{i-1}$ that is one smaller than the bit number $N_i$ is input to one input terminal of the OR circuit provided corresponding to the bit number $N_i$, and a control value is input to the other input terminal. The control value is generated by the priority update circuit 44 based on the transition acceptance F and the transition number N. The control value becomes 1 when a transition in the state variable having the bit number $N_i$ occurs. When the control value is 0, such an OR circuit outputs the priority of the bit number $N_{i-1}$ that is one smaller than the bit number $N_i$ as the priority of the bit number $N_i$, and when the control value is 1, the OR circuit outputs 1 as the priority of the bit number $N_i$ regardless of the priority of the bit number $N_{i-1}$ that is one smaller than the bit number $N_i$.

Figure 11:
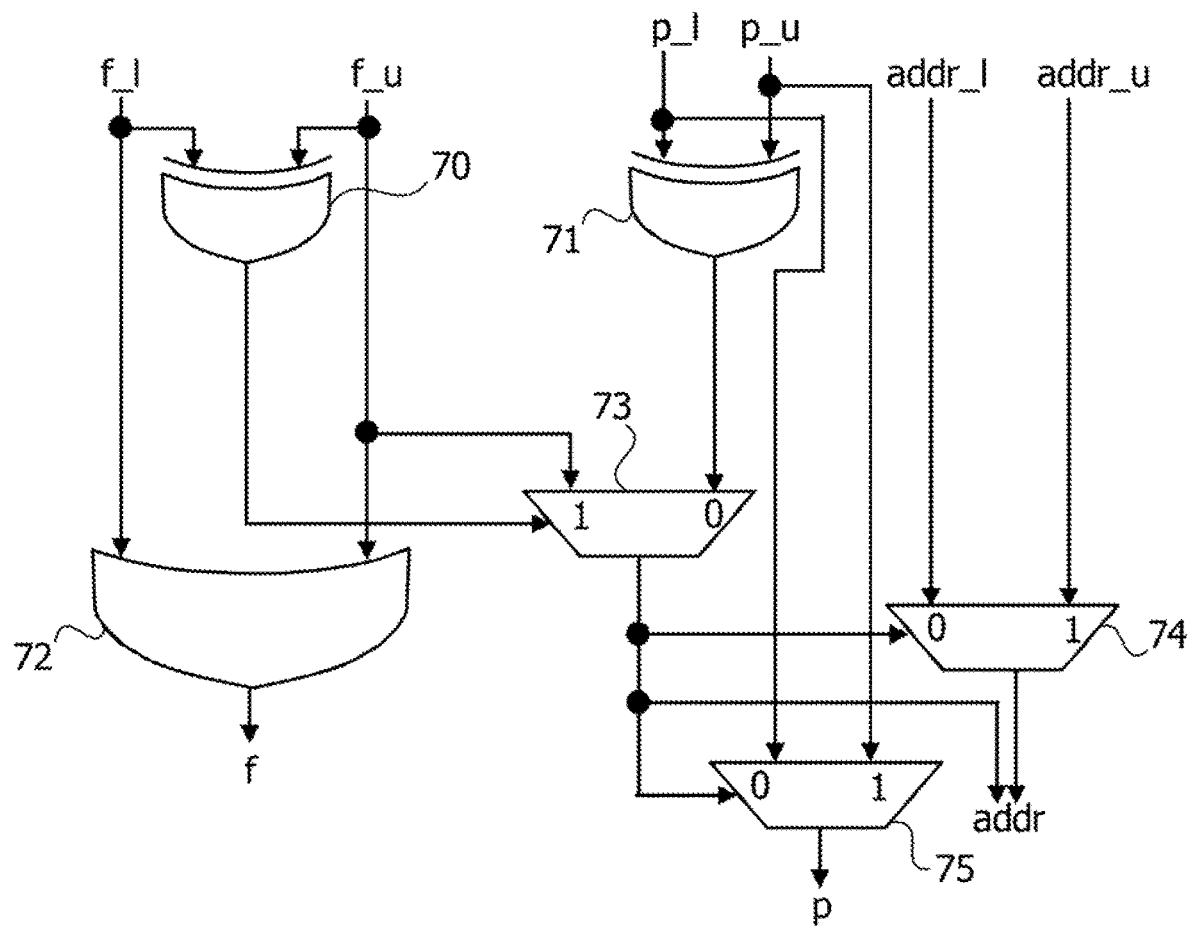
FIG. 11 is a diagram illustrating an example of a selector of a selection circuit unit.

FIG. 11 is a diagram illustrating an example of a selector of a selection circuit unit. FIG. 11 illustrates an example of the selector 43b in the second stage illustrated in FIG. 9.

The selector 43b includes XOR circuits 70 and 71, an OR circuit 72, and 2:1 selectors 73, 74, and 75.

The XOR circuit 70 receives the transition acceptances f_l and f_u output from the two selectors in the previous stage. Of the transition acceptances f_l and f_u, the transition acceptance f_l is a transition acceptance of a state transition having a smaller bit number, and the transition acceptance f_u is a transition acceptance of a state transition having a larger bit number. The XOR circuit 70 outputs 0 when the values of the transition acceptances f_l and f_u coincide with each other, and outputs 1 when the values of the transition acceptances f_l and f_u are different from each other.

The XOR circuit 71 receives the priorities p_l and p_u output from the two selectors in the previous stage. Of the priorities p_l and p_u, the priority p_l is the priority set for the smaller bit number, and the priority p_u is the priority set for the larger bit number. The XOR circuit 71 outputs 0 when the values of the priorities p_l and p_u coincide with each other, and outputs 1 when the values of the priorities p_l and p_u are different from each other.

The OR circuit 72 receives the transition acceptances f_l and f_u, and when any one or both of the transition acceptances f_l and f_u are 1, the OR circuit 72 outputs 1 as the transition acceptance (denoted as f), and when both of the transition acceptances f_l and f_u are 0, the OR circuit 72 outputs 0 as the transition acceptance f.

The 2:1 selector 73 receives the transition acceptance f_u and the value of 0 or 1 output from the XOR circuit 71. When the output of the XOR circuit 70 is 1, the 2:1 selector 73 selects and outputs the value of the transition acceptance f_u, and when the output of the XOR circuit 70 is 0, the 2:1 selector 73 selects and outputs the value output from the XOR circuit 71.

The 2:1 selector 74 receives addresses addr_l and addr_u corresponding to the bit numbers output from the two selectors in the previous stage. Of the addresses addr_l and addr_u, the address addr_l is an address corresponding to the smaller bit number, and the address addr_u is an address corresponding to the larger bit number. The 2:1 selector 74 selects and outputs the address addr_l when the output of the 2:1 selector 73 is 0, and selects and outputs the address addr_u when the output of the 2:1 selector 73 is 1. The address addr output from the selector 43b is obtained by adding the value that has one bit and that is output from the 2:1 selector 73 to the address addr_l or the address addr_u output from the 2:1 selector 74 (to the upper bit).

The 2:1 selector 75 receives the priorities p_l and p_u, selects and outputs the priority p_l when the output of the 2:1 selector 73 is 0, and selects and outputs the priority p_u when the output of the 2:1 selector 73 is 1. The priority output from the 2:1 selector 75 is denoted as p.

The selectors other than the selectors in the first stage illustrated in FIG. 9 may also be implemented by the same circuit configuration as that of the selector 43b illustrated in FIG. 11. The selector in the first stage has a circuit configuration in which the 2:1 selector 74 illustrated in FIG. 11 is not provided.

The optimization device 60 according to the second embodiment may be provided by using, for example, the transition acceptance selection circuit 61a having the circuit configuration as described above.

Third Embodiment

Figure 12:
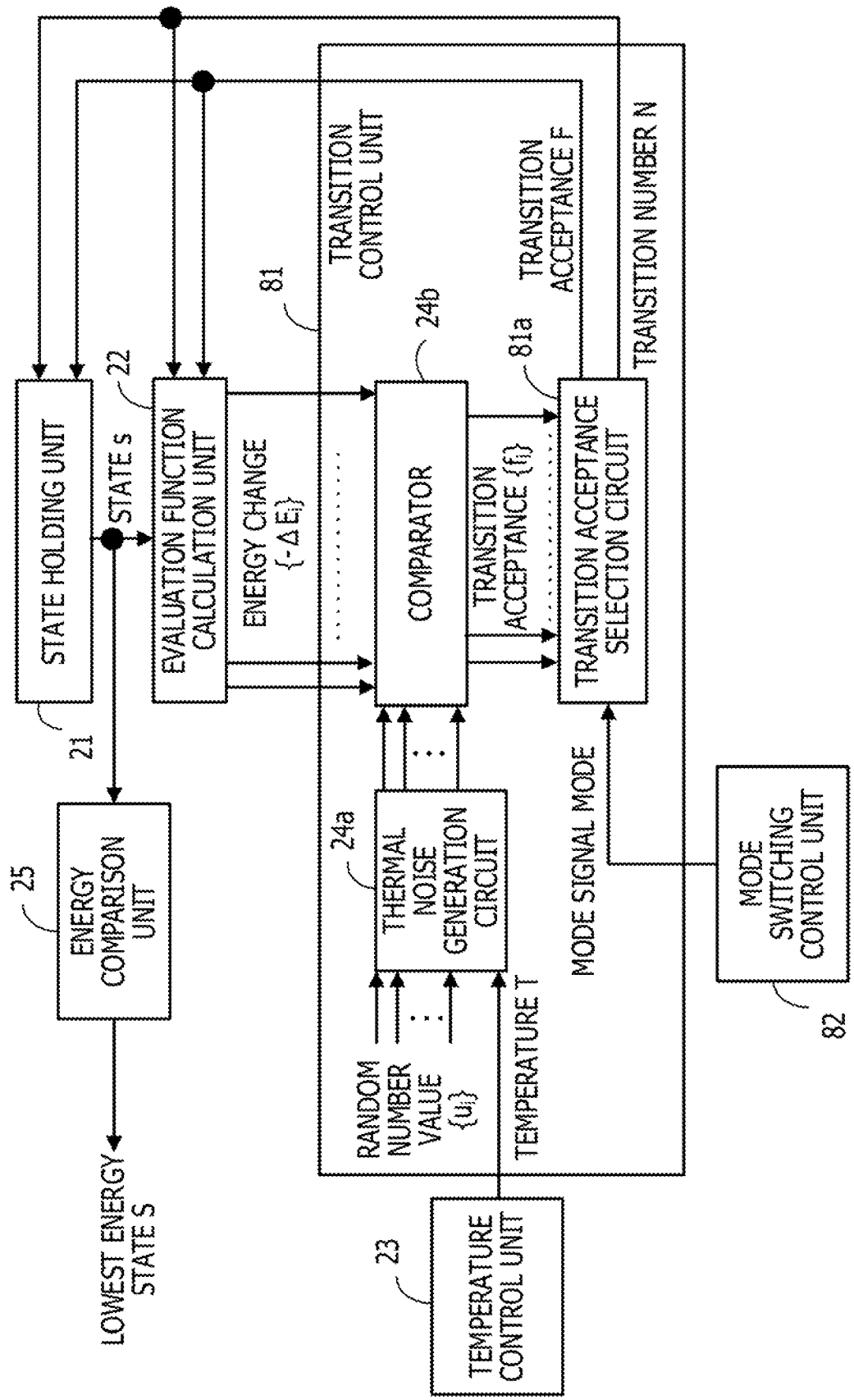
FIG. 12 is a diagram illustrating an example of an optimization device according to a third embodiment.

FIG. 12 is a diagram illustrating an example of an optimization device according to a third embodiment. In FIG. 12, the same components as those of the optimization device 20 illustrated in FIG. 1 or the optimization device 60 illustrated in FIG. 8 are assigned the same reference signs.

In the optimization device 80 according to the third embodiment, a transition control unit 81 has the same function as the transition control units 24 and 61 of the optimization devices 20 and 60. The transition control unit 81 has a function of switching between selecting (sequential selection) a state transition that becomes a transition candidate based on the priority information (priority $\{p_i\}$) and randomly selecting a state transition that becomes a transition candidate based on a random number value, in response to a mode signal MODE.

For example, when the mode signal MODE is 1, the transition control unit 81 performs the sequential selection, and when the mode signal MODE is 0, the transition control unit 81 randomly selects a state transition that becomes a transition candidate based on a random number value.

The mode signal MODE is input from a mode switching control unit 82 as illustrated in FIG. 12, for example. The mode switching control unit 82 and the temperature control unit 23 may be the same control unit (controller).

The switching described above is performed by the transition acceptance selection circuit 81a of the transition control unit 81.

Figure 13:
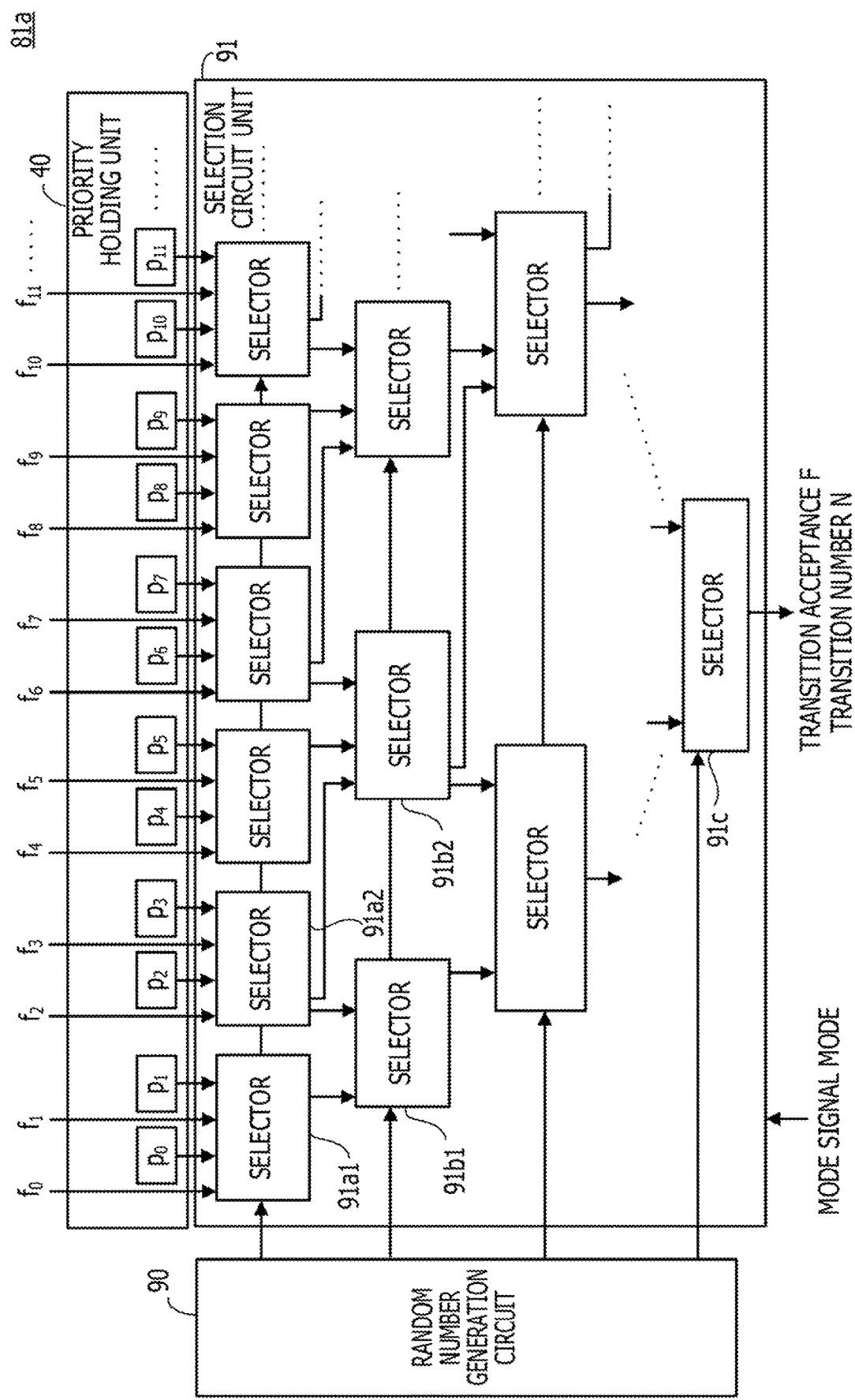
FIG. 13 is a diagram illustrating an example of a transition acceptance selection circuit in the optimization device according to the third embodiment.

FIG. 13 is a diagram illustrating an example of a transition acceptance selection circuit in the optimization device according to the third embodiment. In FIG. 13, the same components as those of the transition acceptance selection circuit 24c illustrated in FIG. 6 are assigned the same reference signs. In FIG. 13, illustration of the priority update circuit 42 is omitted.

The transition acceptance selection circuit 81a in the optimization device 80 according to the third embodiment includes a random number generation circuit 90. The random number generation circuit 90 generates a random number value, and supplies the generated random number value to a selection circuit unit 91. For example, the random number generation circuit 90 generates a random number value different for each stage and supplies the generated random values to a plurality of selectors arranged in a plurality of stages in the binary tree structure in the selection circuit unit 91. The random number generation circuit 90 may be implemented by using, for example, a linear feedback shift register (LFSR), or the like.

The selection circuit unit 91 is supplied with the mode signal MODE and a random number value output from the random number generation circuit 90. Similarly to the selection circuit unit 41 illustrated in FIG. 6, the selection circuit unit 91 includes the plurality of selectors (selectors 91a1, 91a2, 91b1, 91b2, 91c, and the like) arranged in the plurality of stages in the binary tree structure, and each selector is supplied with a random number value and the mode signal MODE.

Figure 14:
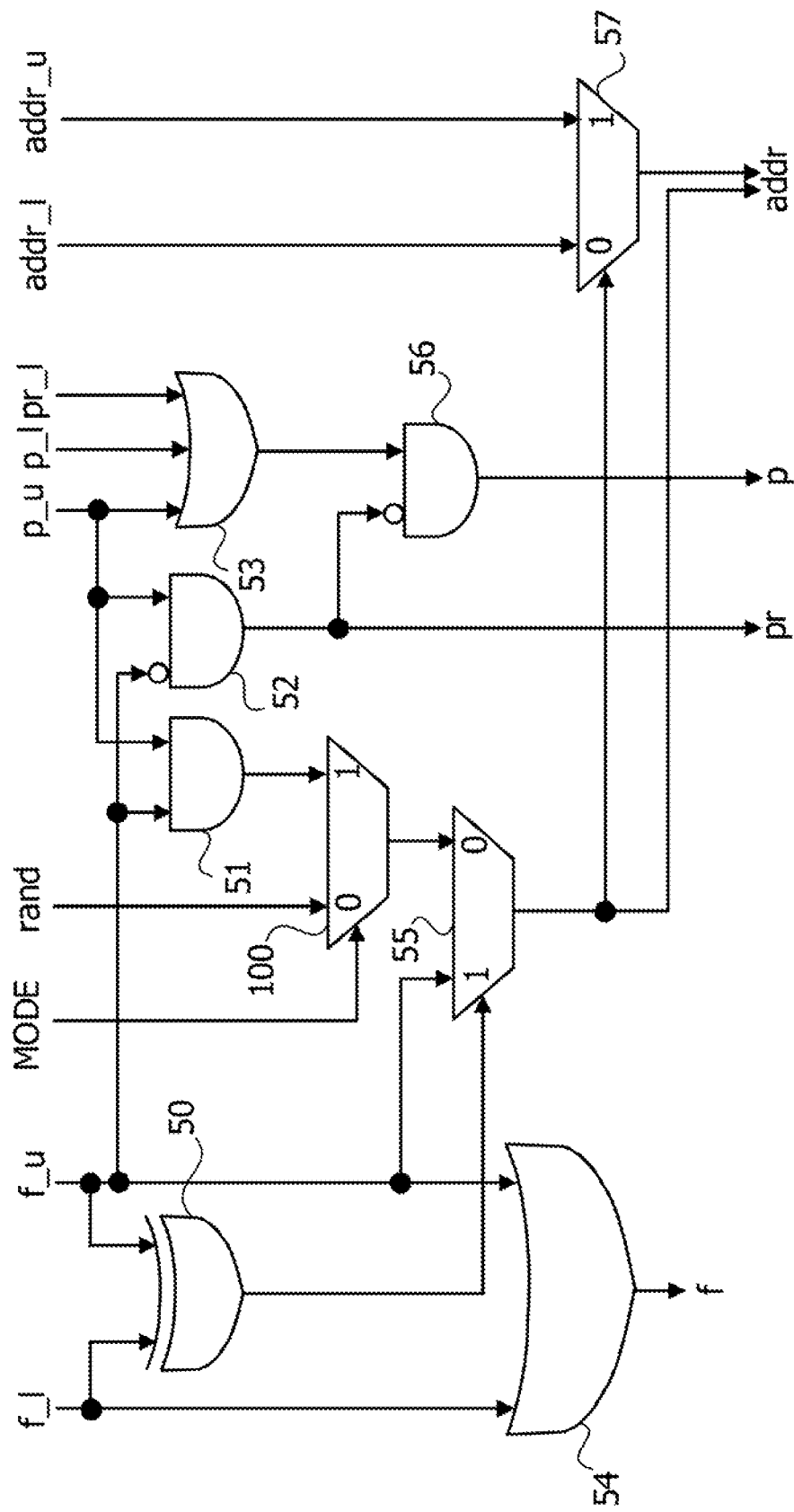
FIG. 14 is a diagram illustrating an example of a selector of a selection circuit unit.

FIG. 14 is a diagram illustrating an example of a selector of a selection circuit unit. FIG. 14 illustrates an example of the selector 91b2 in the second stage illustrated in FIG. 13. In FIG. 14, the same components as those of the selector 41b2 illustrated in FIG. 7 are assigned the same reference signs.

The selector 91b2 has a 2:1 selector 100 in which one input terminal thereof is coupled with an output terminal of the AND circuit 51 and the other input terminal thereof is input with the random number value rand, and in which one of an output value of the AND circuit 51 and the random number value rand is selected and output in response to the mode signal MODE. The random number value rand is a value having one bit (0 or 1).

In the example of FIG. 14, the 2:1 selector 100 selects and outputs the random number value rand supplied from the random number generation circuit 90 when the mode signal MODE is 0, and selects and outputs an output value from the AND circuit 51 when the mode signal MODE is 1.

When the value output from the XOR circuit 50 is 0, the 2:1 selector 55 selects and outputs the output from the 2:1 selector 100.

By using the selector 91b2, when the transition acceptances f_l and f_u of the two state transitions are the same value, the sequential selection is performed when the mode signal MODE is 1, and a state transition that becomes a transition candidate is randomly selected when the transition acceptances f_l and f_u are 0.

The other selectors illustrated in FIG. 13 may also be implemented by substantially the same circuit configuration as that of the selector 91b2 illustrated in FIG. 14. However, the selector in the first stage is not provided with the 2:1 selector 57 illustrated in FIG. 14, and the priority transmission signal pr_l is not input to the OR circuit 53. A selector that is the selector located at the left side of the binary tree structure or the selector located at the right side of the two selectors coupled to the same selector in the next stage, but that does not have a selector at the right adjacent to the selector in the next stage does not output the priority transmission signal pr. The AND circuits 52 and 56 and the OR circuit 53 may not be provided in the selector 41c in the last stage.

It is also possible to install the switching function in the transition acceptance selection circuit 61a of the optimization device 60 according to the second embodiment.

Figure 15:
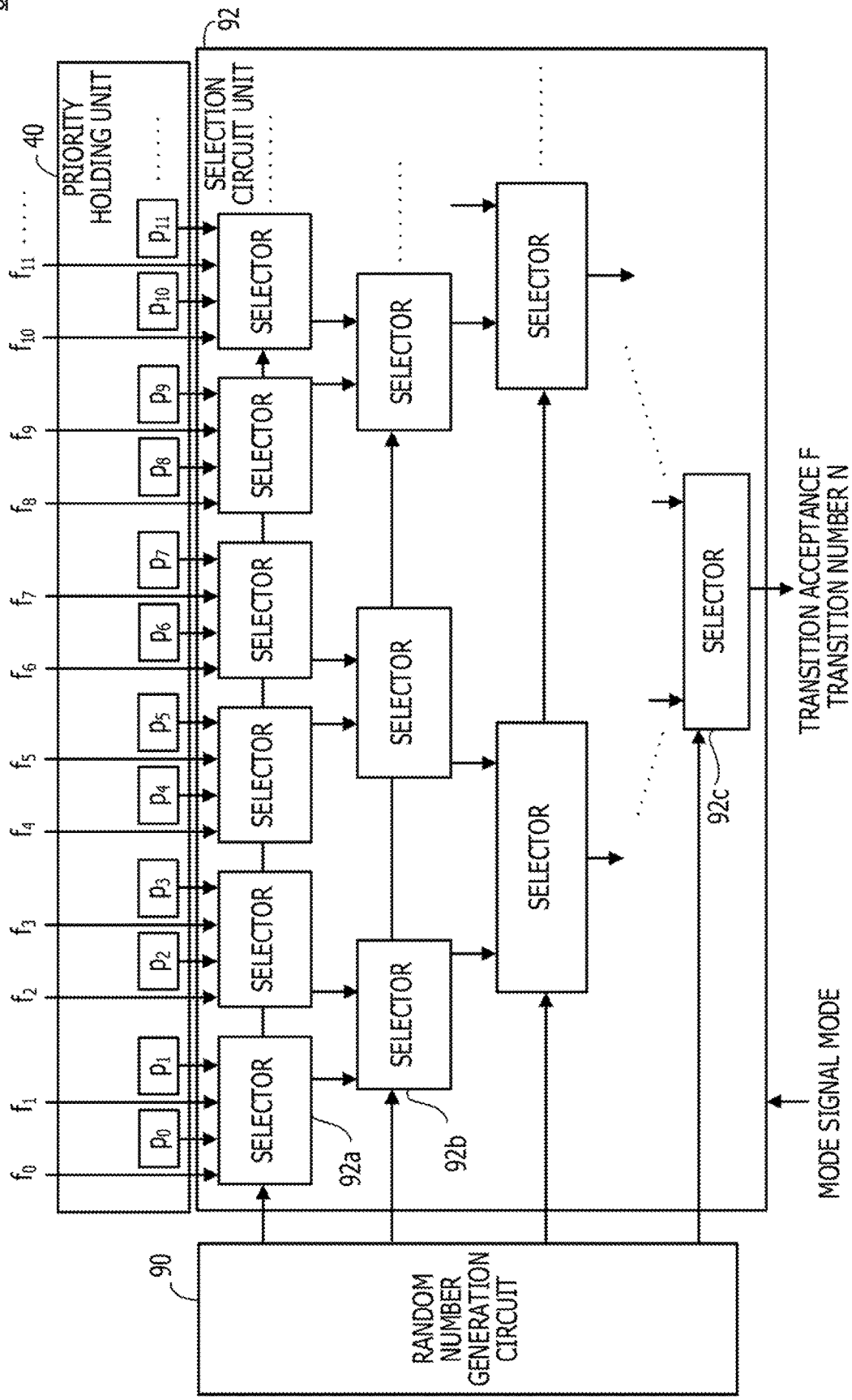
FIG. 15 is a diagram illustrating another example of the transition acceptance selection circuit in the optimization device according to the third embodiment.

FIG. 15 is a diagram illustrating another example of the transition acceptance selection circuit in the optimization device according to the third embodiment. A transition acceptance selection circuit 81b illustrated in FIG. 15 is provided with the above-described switching function in the transition acceptance selection circuit 61a of the optimization device 60 according to the second embodiment. In FIG.

15, the same components as those of the transition acceptance selection circuit 61a illustrated in FIG. 9 and the transition acceptance selection circuit 81a illustrated in FIG. 13 are assigned the same reference signs. In FIG. 15, illustration of the priority update circuit 44 is omitted.

A selection circuit unit 92 is supplied with the mode signal MODE and a random number value output from the random number generation circuit 90. Similarly to the selection circuit unit 43 illustrated in FIG. 9, the selection circuit unit 92 includes a plurality of selectors (selectors 92a, 92b, 92c, and the like) arranged in a plurality of stages in a binary tree structure, and a random number value and the mode signal MODE are supplied to each of the selectors.

Figure 16:
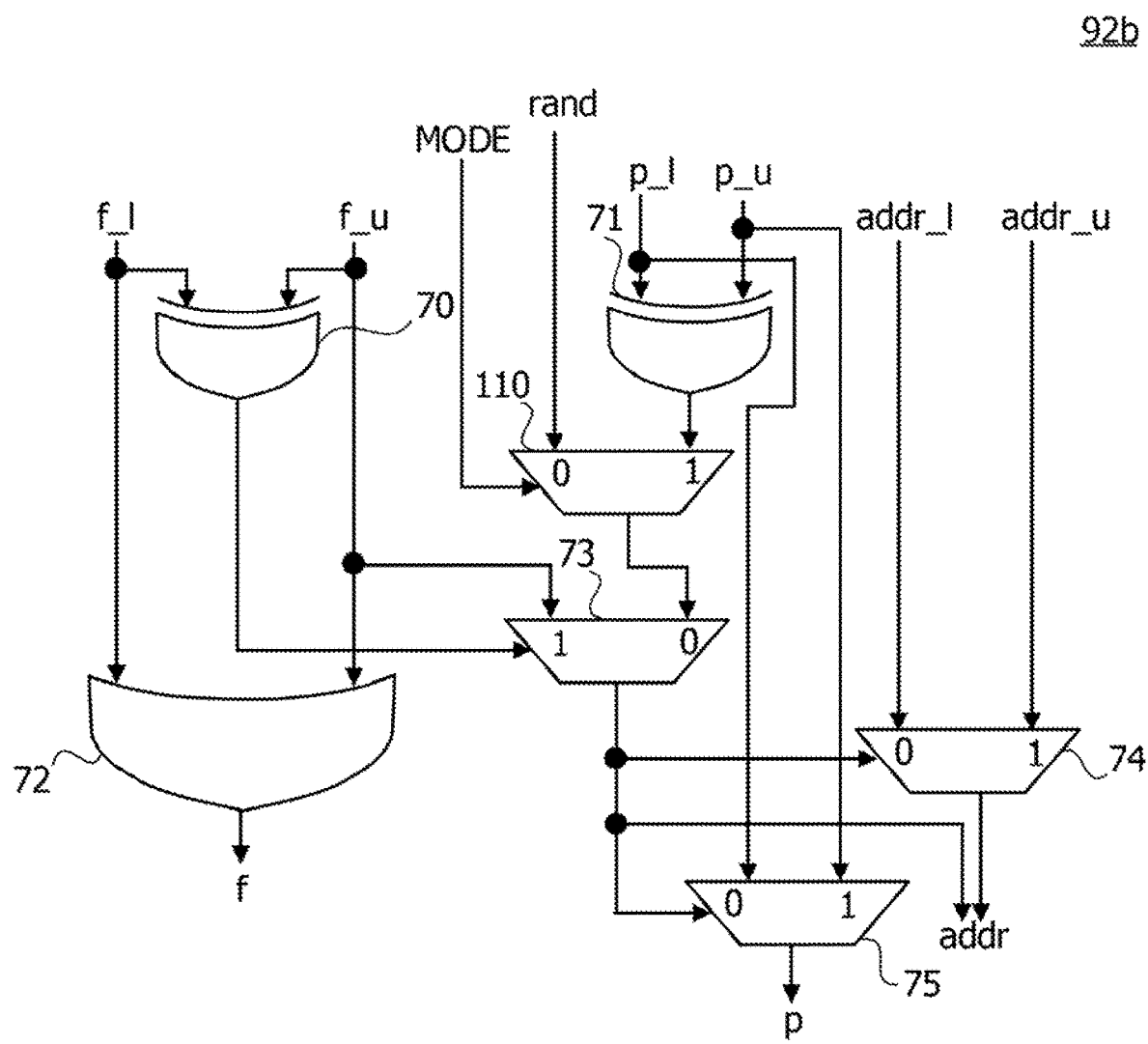
FIG. 16 is a diagram illustrating an example of a selector of a selection circuit unit.

FIG. 16 is a diagram illustrating an example of a selector of a selection circuit unit. FIG. 16 illustrates an example of the selector 92b in the second stage illustrated in FIG. 15. In FIG. 16, the same components as those of the selector 43b illustrated in FIG. 11 are assigned the same reference signs.

The selector 92b has a 2:1 selector 110 in which one input terminal thereof is coupled with an output terminal of the XOR circuit 71 and the other input terminal thereof is input with the random number value rand, and in which one of an output value of the XOR circuit 71 and the random number value rand is selected and output in response to the mode signal MODE. The random number value rand is a value having one bit (0 or 1).

In the example of FIG. 16, the 2:1 selector 110 selects and outputs the random number value rand supplied from the random number generation circuit 90 when the mode signal MODE is 0, and selects and outputs the value output from the XOR circuit 71 when the mode signal MODE is 1.

When the value output from the XOR circuit 70 is 0, the 2:1 selector 73 selects and outputs the output from the 2:1 selector 110.

By using the selector 92b, in a case where the transition acceptances f_l and f_u of the two state transitions are the same value, the sequential selection is performed when the mode signal MODE is 1, and a state transition that becomes a transition candidate is randomly selected when the mode signal MODE is 0.

The selectors other than the selectors in the first stage illustrated in FIG. 15 may also be implemented by the same circuit configuration as that of the selector 92b illustrated in FIG. 16. The selector in the first stage has a circuit configuration in which the 2:1 selector 74 illustrated in FIG. 16 is not provided.

Since the optimization device 80 according to the third embodiment may switch whether a state transition that becomes a transition candidate is selected based on the priority information (the sequential selection) or is randomly selected, it is possible to select calculation suitable for the combinatorial optimization problem that is the calculation target.

As described above, although one aspect of an optimization device and a control method of the optimization device according to the present disclosure has been described based on the embodiments, such an aspect is a mere example and not limited to the above description.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
  a memory configured to:
    hold each of values of a plurality of state variables included in an evaluation function representing energy;
  an evaluation function calculation circuit configured to calculate the change value of the energy for each of a plurality of state transitions, when a state transition occurs due to a change of any of the values of the plurality of state variables;
  a processor configured to control a temperature;
  a transition control circuit configured to select any of the plurality of state transitions, based on priority information set for each of the plurality of state variables and set based on state transition information updated last time with respect to identification information to identify each state transition, and transition acceptance information indicating transition acceptance determined based on the change value of the energy, and a thermal noise; and
  an enemy comparison circuit configured to output a minimum energy state which is the values of the plurality of state variables when the energy to be updated based on the selected state transition becomes a minimum value,
  the transition control circuit includes:
  a priority update circuit configured to update the priority information;
  a thermal noise generation circuit configure to calculate, for each of the plurality of state variables, the thermal noise by multiplying the temperature to a value obtained by converting a random number value using a function to divide the change value of the enemy by the temperature;
  a comparator configured to compare the thermal noise and the change value of the energy for a corresponding state variable and output a comparison result; and
  a transition acceptance selection circuit configured to select any one of the plurality of state transitions based on the priority information and the comparison result as the state transition information,
  the priority update circuit updates the priority information in such a manner that a priority for a state variable in which a state transition is performed previously becomes lower than priorities for other state variables, and
  the transition control circuit includes a plurality of selectors arranged in a binary structure and each of the plurality of the selectors selects a state transition having a higher priority than another state transition.

2. The information processing device according to claim 1, wherein the identification information is a plurality of numbers for identifying each state transition, and the processor is configured to select a state transition from a smaller number or a larger number based on the priority information.

3. The information processing device according to claim 2, wherein the processor is configured to: set, when selecting a state transition from a smaller number, a number that is one larger than an update number for identifying the state transition updated last time among the plurality of numbers to a first value as the priority information and set the other numbers to a second value different from the first value as the priority information; and set, when selecting a state transition from a larger number, a number that is one smaller than the update number to the first number as the priority information and set the other numbers to the second number as the priority information.

4. The information processing device according to claim 2, wherein the processor is configured to: set, when selecting a state transition from a smaller number, numbers that are larger than an update number for identifying the state transition updated last time among the plurality of numbers to a first value as the priority information and set numbers equal to and smaller than the update number to a second value different from the first value as the priority information; and set, when selecting a state transition from a larger number, numbers that are smaller than the update number to the first number as the priority information and set numbers equal to and larger than the update number to the second number as the priority information.

5. The information processing according to claim 1, wherein the processor is configured to switch whether to select a state transition based on the priority information, or to randomly select a state transition based on a random number value, in response to a mode signal that is input.

* * * * *